(12) United States Patent
Hong et al.

(10) Patent No.: US 12,074,142 B2
(45) Date of Patent: Aug. 27, 2024

(54) SEMICONDUCTOR PACKAGE AND METHOD OF FABRICATING THE SAME

(71) Applicant: Samsung Electronics Co., Ltd., Suwon-si (KR)

(72) Inventors: Jongpa Hong, Suwon-si (KR); Hwail Jin, Seongnam-si (KR); Sang-Sick Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 331 days.

(21) Appl. No.: 17/669,773

(22) Filed: Feb. 11, 2022

(65) Prior Publication Data

US 2022/0406755 A1 Dec. 22, 2022

(30) Foreign Application Priority Data

Jun. 17, 2021 (KR) .................. 10-2021-0078746

(51) Int. Cl.
*H01L 21/00* (2006.01)
*H01L 23/00* (2006.01)
(Continued)

(52) U.S. Cl.
CPC ...... *H01L 25/0657* (2013.01); *H01L 23/3157* (2013.01); *H01L 23/481* (2013.01); *H01L 24/16* (2013.01); *H01L 24/17* (2013.01); *H01L 24/73* (2013.01); *H01L 24/81* (2013.01); *H01L 25/50* (2013.01); *H01L 2224/16146* (2013.01); *H01L 2224/17177* (2013.01); *H01L 2224/73204* (2013.01); *H01L 2224/81203* (2013.01)

(58) Field of Classification Search
CPC ...................... H01L 25/0657; H01L 23/3157; H01L 23/481
See application file for complete search history.

(56) References Cited

U.S. PATENT DOCUMENTS 6,285,560 B1 * 9/2001 Lyne ................ H01L 23/49811
174/266
7,381,592 B2 6/2008 Yoshimura
(Continued)

FOREIGN PATENT DOCUMENTS

CN 115497897 A * 12/2022 ......... H01L 23/3157
KR 2019/0087897 A 7/2019

*Primary Examiner* — Laura M Menz
(74) *Attorney, Agent, or Firm* — HARNESS, DICKEY & PIERCE, P.L.C.

(57) ABSTRACT

Disclosed are semiconductor packages and their fabricating methods. The semiconductor package comprises connection terminals between a first die and a second die. The first die has signal and peripheral regions and includes first vias on the peripheral region. The second die is on the first die and has second vias on positions that correspond to the first vias. The connection terminals connect the second vias to the first vias. The peripheral region includes first regions adjacent to corners of the first die and second regions adjacent to lateral surfaces of the first die. The connection terminals include first connection terminals on the first regions and second connection terminals on the second regions. A sum of areas of the first connection terminals per unit area on the first regions is greater than that of areas of the second connection terminals per unit area on the second regions.

20 Claims, 20 Drawing Sheets

(51) Int. Cl.
*H01L 23/31* (2006.01)
*H01L 23/48* (2006.01)
*H01L 25/00* (2006.01)
*H01L 25/065* (2023.01)

(56) References Cited

U.S. PATENT DOCUMENTS

| | | | |
|---|---|---|---|
| 7,446,398 B2* | 11/2008 | Niu | H01L 23/49838 |
| | | | 361/755 |
| 7,759,799 B2 | 7/2010 | Ejima | |
| 7,795,743 B2* | 9/2010 | Kim | H01L 23/562 |
| | | | 257/772 |
| 7,811,903 B2 | 10/2010 | Grigg et al. | |
| 8,916,875 B2 | 12/2014 | Lee | |
| 9,872,397 B2 | 1/2018 | Brist | |
| 10,177,107 B2* | 1/2019 | Camarota | H01L 23/49827 |
| 10,658,300 B2 | 5/2020 | Kim et al. | |
| 10,903,142 B2* | 1/2021 | Cheah | H01L 23/481 |
| 11,495,576 B2* | 11/2022 | Kim | H01L 25/0657 |
| 11,842,982 B2* | 12/2023 | Lee | H01L 25/0652 |
| 2015/0130083 A1* | 5/2015 | Park | H01L 23/3157 |
| | | | 438/109 |
| 2017/0243856 A1* | 8/2017 | Park | H01L 25/50 |
| 2017/0243857 A1* | 8/2017 | Hwang | H01L 24/92 |
| 2019/0221520 A1* | 7/2019 | Kim | H01L 24/06 |
| 2020/0043831 A1* | 2/2020 | Cheah | H01L 23/481 |
| 2021/0005576 A1* | 1/2021 | Kim | H01L 25/0657 |
| 2021/0111159 A1* | 4/2021 | Park | H01L 25/0657 |
| 2021/0143116 A1* | 5/2021 | Hong | H01L 25/0657 |
| 2021/0407949 A1* | 12/2021 | Park | H01L 24/06 |
| 2022/0139873 A1* | 5/2022 | Lee | H01L 25/50 |
| | | | 257/777 |
| 2022/0157694 A1* | 5/2022 | Cheah | H01L 25/50 |
| 2022/0293566 A1* | 9/2022 | Park | H01L 24/73 |
| 2022/0344280 A1* | 10/2022 | Hsieh | H01L 23/5384 |
| 2022/0406755 A1* | 12/2022 | Hong | H01L 21/568 |
| 2023/0087718 A1* | 3/2023 | Park | H01L 21/6836 |
| | | | 438/667 |
| 2023/0109292 A1* | 4/2023 | Jin | H01L 24/16 |
| | | | 257/783 |
| 2023/0230946 A1* | 7/2023 | Kim | H01L 24/08 |
| | | | 257/786 |
| 2023/0361003 A1* | 11/2023 | Cheah | H01L 24/09 |
| 2023/0378072 A1* | 11/2023 | Liu | H01L 21/565 |
| 2024/0040805 A1* | 2/2024 | Chung | H10B 80/00 |

* cited by examiner

SEMICONDUCTOR PACKAGE AND METHOD OF FABRICATING THE SAME

CROSS-REFERENCE TO RELATED APPLICATION

This U.S. non-provisional application claims priority under 35 U.S.C. § 119 to Korean Patent Application No. 10-2021-0078746, filed on Jun. 17, 2021 in the Korean Intellectual Property Office, the disclosure of which is hereby incorporated by reference in its entirety.

BACKGROUND

Inventive concepts relate to a semiconductor package and a method of fabricating the same, and more particularly, to a stacked semiconductor package and a method of fabricating the same.

Trends in today's electronics industries are to fabricate lightweight, compact, high speed, multi-functional, and high-performance products at reasonable prices. A multi-chip stacked package technique or a system-in-package technique may be used to meet these trends. In relation to a multi-chip stacked package or a system-in-package, one semiconductor package may perform functions of a number of unit semiconductor devices. Although the multi-chip stacked package or the system-in-package may be somewhat thicker than a typical single chip package, they have a planar size similar to that of a single chip package and thus are primarily used for high-end, compact, and portable products such as mobile phones, laptop computers, memory cards, or portable camcorders. Various research may be required to enhance the performance of the semiconductor package. In particular, through silicon via (TSV) technology has been suggested for high performance in the semiconductor package where wire bonding technology is used.

A stack-type multi-chip semiconductor package uses a circuit layer, a through electrode, a solder bump, and/or a gap fill to stack chips on each other. An increase in integration of chips may induce an increase in amount of solder bumps provided between the chips, and this tendency may cause many problems.

SUMMARY

Some example embodiments of inventive concepts may provide a semiconductor package with increased structural stability and a method of fabricating the same.

Some example embodiments of inventive concepts may provide a semiconductor package with reduced defects and a method of fabricating the same.

According to some example embodiments of inventive concepts, a semiconductor package may include a first die having a signal region and a peripheral region that surrounds the signal region, the first die including a plurality of first vias on the peripheral region; a second die on the first die and having a plurality of second vias on the peripheral region, the plurality of second vias being on positions that correspond to positions of the first vias; and a plurality of connection terminals between the first die and the second die. The connection terminals may connect the second vias to the first vias. The peripheral region may include a plurality of first regions adjacent to corners of the first die when viewed in a plan view and a plurality of second regions adjacent to lateral surfaces of the first die when viewed in a plan view. The plurality of connection terminals may include a plurality of first connection terminals on the plurality of first regions and a plurality of second connection terminals on the plurality of second regions. A sum of areas of the plurality of first connection terminals per unit area on the plurality of first regions may be greater than a sum of areas of the plurality of second connection terminals per unit area on the plurality second regions.

According to some example embodiments of inventive concepts, a semiconductor package may include: a substrate; a plurality of dies that are vertically stacked on the substrate; an under-fill filling a space between the plurality of dies; a molding layer on the substrate and covering the plurality of dies; and a plurality of external terminals on a bottom surface of the substrate. Each of the plurality of dies may include a plurality of vias that vertically penetrate the plurality of dies; a plurality of signal terminals on a signal region of the plurality of dies and coupled to the plurality of vias; and a plurality of power/ground terminals on a peripheral region that surrounds the signal region. The plurality of power/ground terminals may be coupled to the plurality of vias. A number of the plurality of power/ground terminals per unit area on the peripheral region may decrease with an increasing distance from corners of the plurality of dies along lateral surfaces of the plurality of dies.

According to some example embodiments of inventive concepts, a method of fabricating a semiconductor package may include: providing a first die that has a plurality of first regions adjacent to corners of the first die and a plurality of second regions adjacent to lateral surfaces of the first die, when viewed in a plan view; providing a plurality of first connection terminals on the plurality of first regions of the first die; providing a plurality of second connection terminals on the plurality of second regions of the first die; forming on one surface of the first die an under-fill that covers the plurality of first connection terminals and the plurality of second connection terminals; placing a second die on the first die; and performing a thermocompression process on the plurality of first connection terminals and the plurality of second connection terminals to form a plurality of connection terminals that connect the first die to the second die. A sum of areas of the plurality of first connection terminals per unit area on the plurality of first regions may be greater than a sum of areas of the plurality of second connection terminals per unit area on the plurality of second regions. A first top surface of the under-fill on the plurality of first regions may be higher from the one surface of the first die than a second top surface of the under-fill on the plurality of second regions.

DETAILED DESCRIPTION OF EMBODIMENTS

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The following will now describe a semiconductor package according to example embodiments of inventive concepts with reference to the accompanying drawings.

Figure 1:
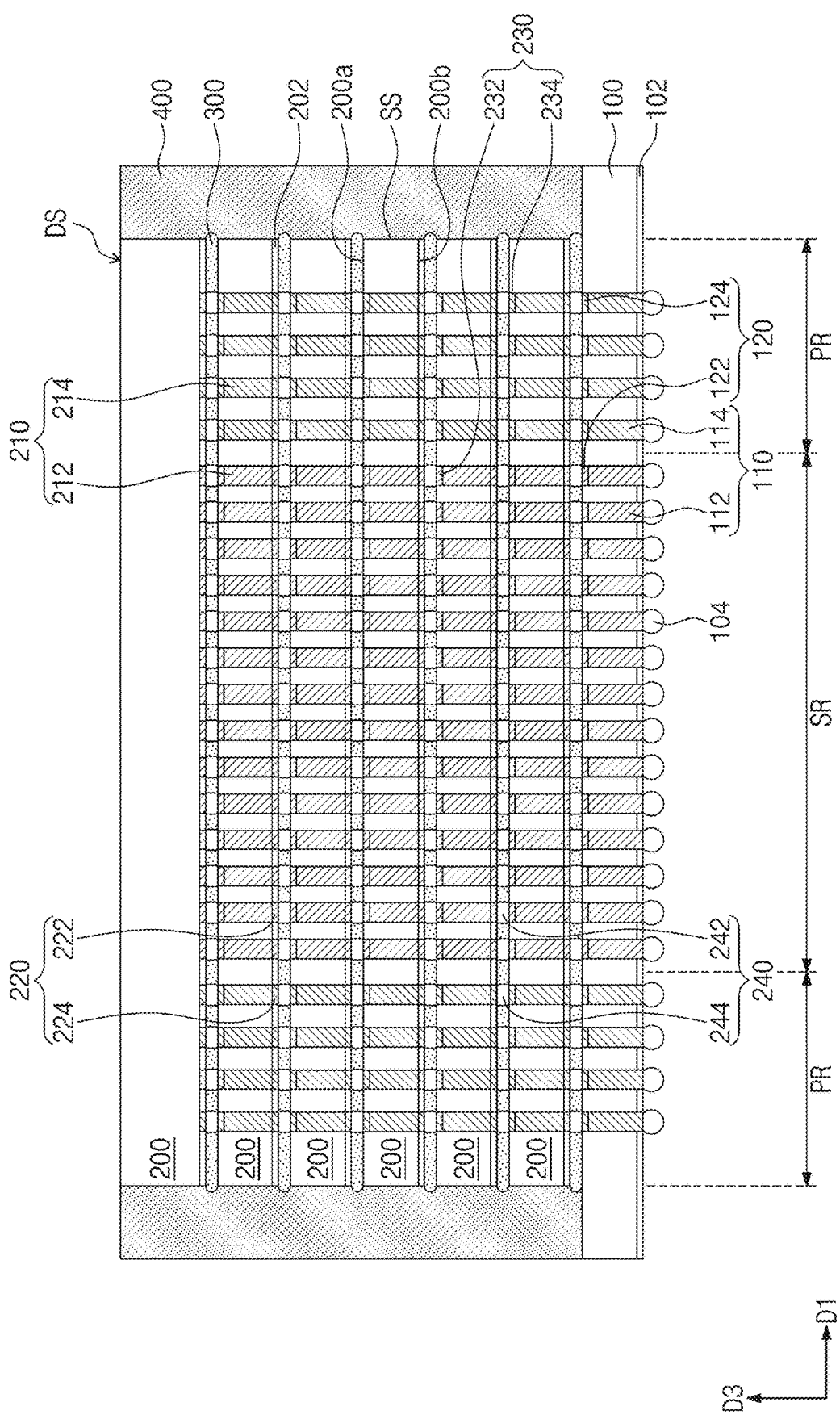
FIG. 1 illustrates a cross-sectional view showing a semiconductor package according to some example embodiments of inventive concepts.
Figure 2:
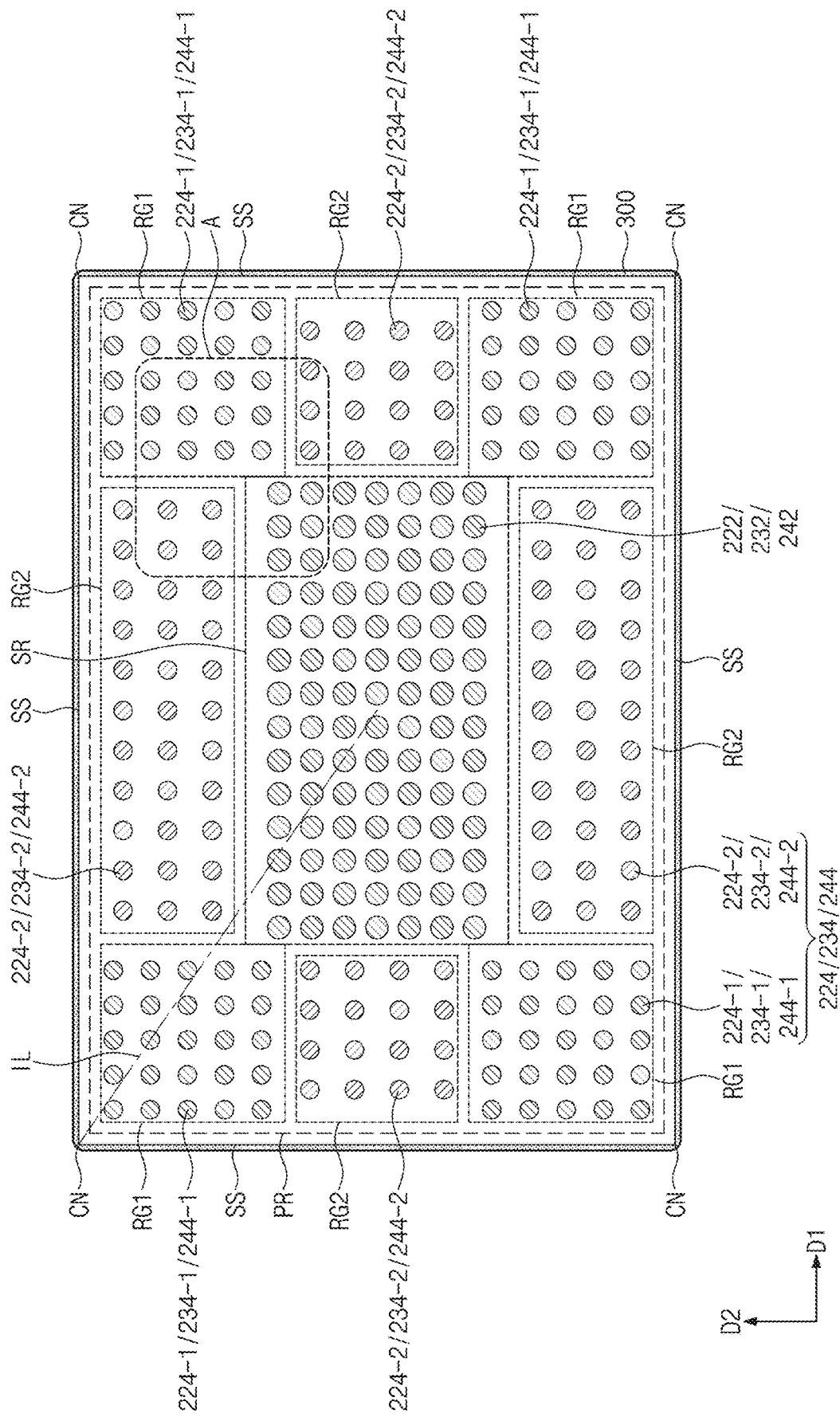
FIG. 2 illustrates a plan view showing a semiconductor package according to some example embodiments of inventive concepts.
Figure 3:
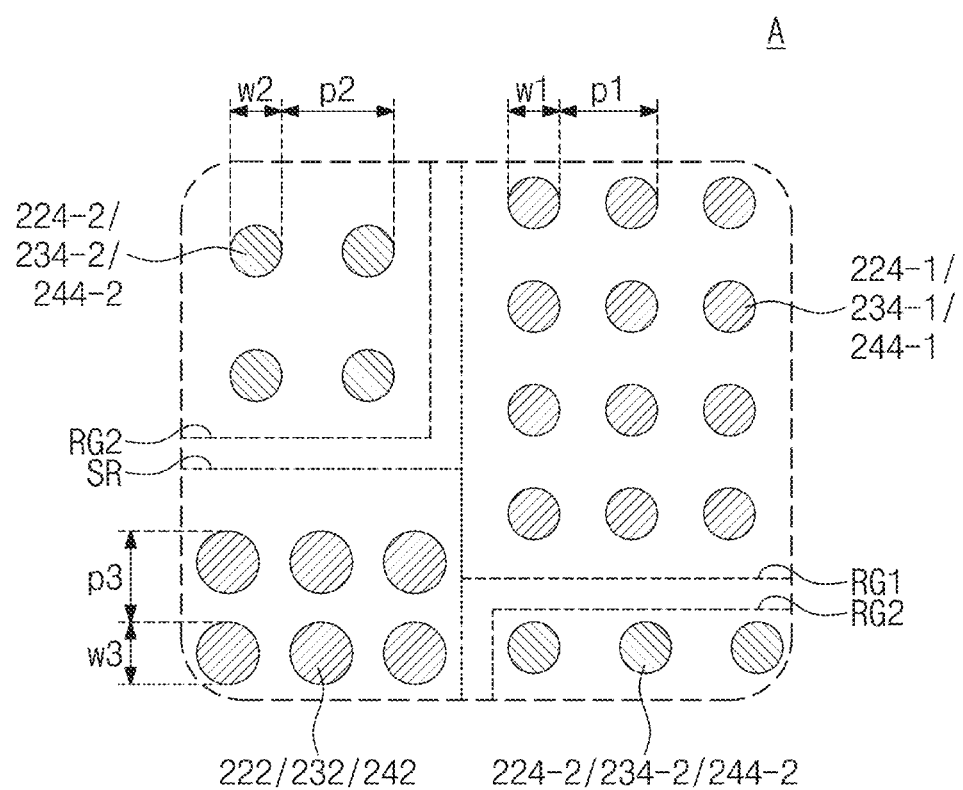
FIG. 3 illustrates an enlarged view showing section A of FIG. 2.
Figure 4:
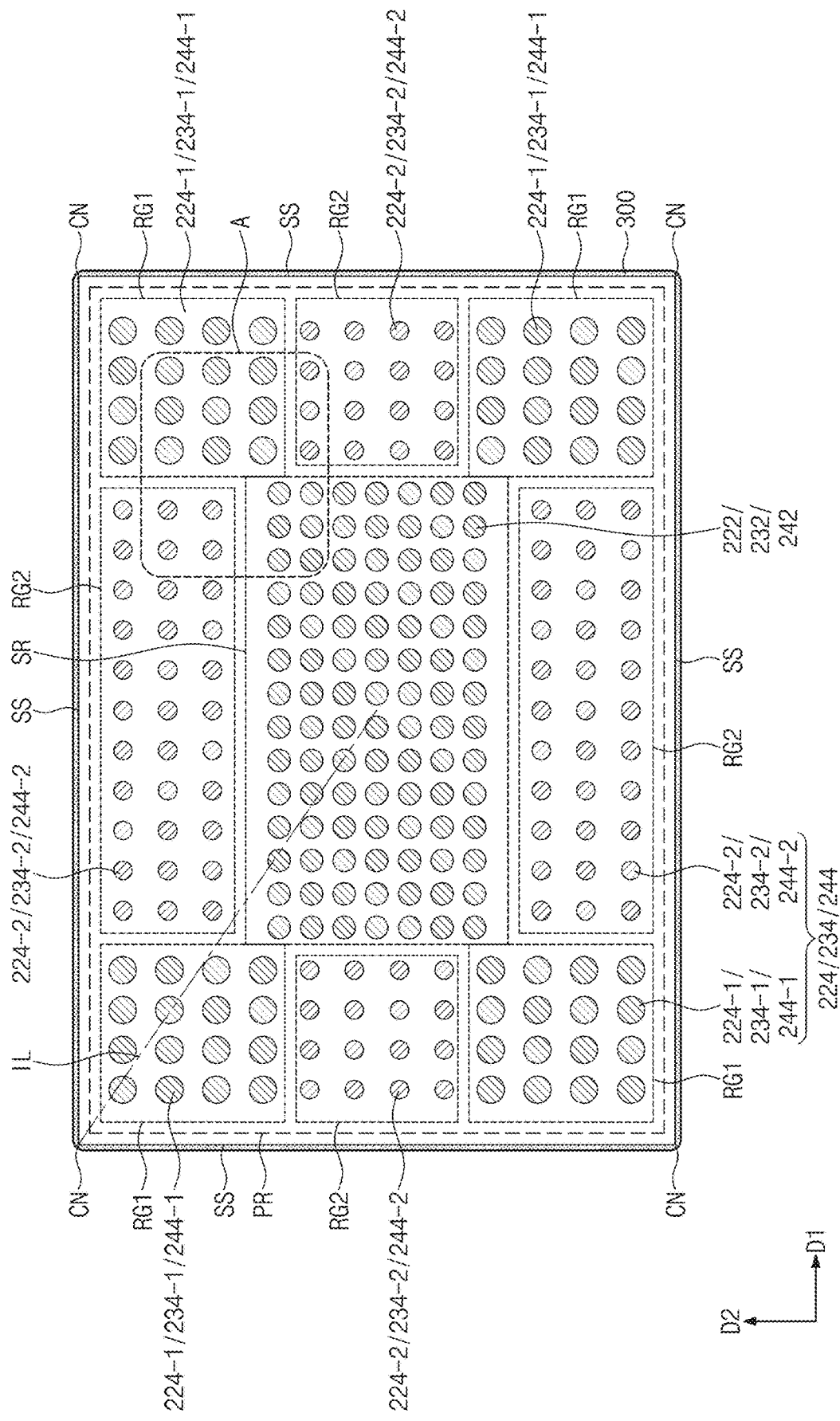
FIG. 4 illustrates a plan view showing a semiconductor package according to some example embodiments of inventive concepts.
Figure 5:
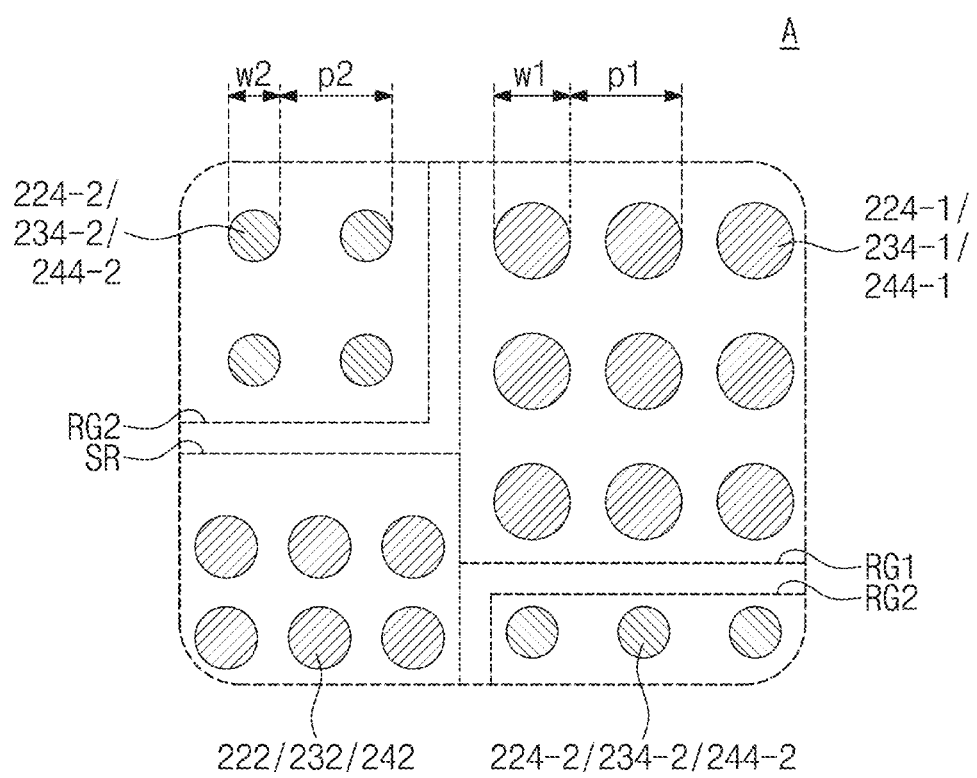
FIG. 5 illustrates an enlarged view showing section A of FIG. 4.

FIG. 1 illustrates a cross-sectional view showing a semiconductor package according to some example embodiments of inventive concepts. FIG. 2 illustrates a plan view showing a semiconductor package according to some example embodiments of inventive concepts. FIG. 3 illustrates an enlarged view showing section A of FIG. 2. FIG. 4 illustrates a plan view showing a semiconductor package according to some example embodiments of inventive concepts. FIG. 5 illustrates an enlarged view showing section A of FIG. 4.

Referring to FIGS. 1 and 2, a semiconductor package according to some example embodiments of inventive concepts may be a stacked package in which vias are used. For example, second dies 200 of the same type may be stacked on a base substrate 100, and the second dies 200 may be electrically connected to each other through second vias 210 that penetrate the second dies 200. The second dies 200 may be coupled to each other through connection terminals 240 that are provided on bottom surfaces 200b of the second dies 200. For example, the second dies 200 may constitute a micro-ball grid array (MBGA) or a micro-pillar grid array (MPGA).

The base substrate 100 may be provided. The base substrate 100 may include an integrated circuit therein. For example, the base substrate 100 may be a first die that includes an electronic element such as a transistor. For example, the base substrate 100 may be a wafer-level semiconductor die formed of a semiconductor such as silicon (Si). FIG. 1 shows an embodiment where the base substrate 100 is a first die, but inventive concepts are not limited thereto. According to some example embodiments of inventive concepts, the base substrate 100 may not include an electronic element such as a transistor. The following will discuss an example in which the base substrate 100 and the first die are the same component.

When viewed in a plan view, the first die 100 may have a signal region SR positioned on a central portion of the first die 100 and a peripheral region PR that surrounds the signal region SR. The signal region SR may be a section on which are provided wiring lines for signals that are processed in the integrated circuit within the first die 100. The signal region SR may extend in a first direction D1. The signal region SR may have a rectangular planar shape. The peripheral region PR may be either a section on which are provided wiring lines for various signals (e.g., power signal and ground signal) for driving the integrated circuit in the first die 100 or a section on which are provided one or more thermal conductive members (e.g., dummy via or dummy solder) for externally transferring heat generated from the first die 100. The peripheral region PR may not include a wiring line electrically connected to the integrated circuit in the first die 100. The peripheral region PR may surround the signal region SR. Inventive concepts, however, are not limited thereto, and the peripheral region PR and the signal region SR may be placed in various ways, if necessary. For example, the signal region SR may run in the first direction D1 across the first die 100, and one or more peripheral regions PR may be disposed on opposite sides of the signal region SR. In this case, the peripheral regions PR may extend in the first direction D1. For example, the signal region SR may extend in the first direction D1 between (or within) the peripheral regions PR. When viewed in a plan view, the peripheral regions PR may include first regions RG1 adjacent to corners of the first die 100 and second regions RG2 adjacent to lateral surfaces of the first die 100. A detailed shape and arrangement of the peripheral region PR will be discussed in detail below based on the second die 200.

The first die 100 may include a first circuit layer 102 and first vias 110.

The first circuit layer 102 may be provided on a bottom surface of the first die 100. The first circuit layer 102 may include the integrated circuit. For example, the first circuit layer 102 may be a memory circuit, a logic circuit, or a combination thereof. For example, the bottom surface of the first die 100 may be an active surface of the first die 100.

The first vias 110 may penetrate in a third direction D3 through the first die 100. The first vias 110 may be electrically connected to the first circuit layer 102. The first vias 110 may include first signal vias 112 provided on the signal region SR and first power/ground vias 114 provided on the peripheral region PR.

The first signal vias 112 may be electrically connected to the integrated circuit of the first die 100. On the signal region SR, the first signal vias 112 may be arranged along first and second directions D1 and D2. For example, the first signal vias 112 may be provided in a grid shape. Alternatively, the first signal vias 112 may be arranged in rows, which rows may be shifted from each other in the first direction D1 or the second direction D2. For example, the first signal vias 112 may be disposed in a zigzag shape along the first direction D1 or the second direction D2. For another example, the first signal vias 112 may be arranged in a honeycomb shape.

The first power/ground vias 114 may be electrically connected to a power or ground circuit of the first die 100. The first power/ground vias 114 may be electrically insulated from the first signal vias 112. On the peripheral region PR, the first power/ground vias 114 may be arranged along the first direction D1 and the second direction D2. For example, the first power/ground vias 114 may be provided in a grid shape. Alternatively, the first power/ground vias 114 may be arranged in rows, which rows may be shifted from each other in the first direction D1 or the second direction D2. For example, the first power/ground vias 114 may be disposed in a zigzag shape along the first direction D1 or the second direction D2. For another example, the first power/ground vias 114 may be arranged in a honeycomb shape.

The first die 100 may include first upper pads 120 disposed on a top surface of the first die 100. The first upper pads 120 may include first upper signal pads 122 provided on the signal region SR and first upper power/ground pads 124 provided on the peripheral region PR.

The first upper signal pads 122 may be correspondingly coupled to the first vias 110. For example, on the signal region SR, the first upper signal pads 122 may be coupled to the first signal vias 112. The first upper signal pads 122 may each have a circular planar shape. An arrangement of the first upper signal pads 122 may conform to that of the first signal vias 112. For example, the first upper signal pads 122 may be arranged along the first direction D1 and the second direction D2.

The first upper power/ground pads 124 may be correspondingly coupled to the first vias 110. For example, on the peripheral region PR, the first upper power/ground pads 124 may be coupled to the first power/ground vias 114. The first upper power/ground pads 124 may each have a circular planar shape. An arrangement of the first upper power/ground pads 124 may conform to that of the first power/ground vias 114. For example, the first upper power/ground pads 124 may be arranged along the first direction D and the second direction D2. According to some example embodiments, some of the first upper power/ground pads 124 may not be coupled to the first power/ground vias 114. For example, the some of the first upper power/ground pads 124 may be dummy pads for discharging heat generated from the first die 100. In this case, the some of the first upper power/ground pads 124 may be electrically insulated from the first vias 110. In addition, the first upper power/ground pads 124 may be electrically insulated from the first signal vias 112. The following description will focus on the embodiment of FIG. 2.

A shape and arrangement of the first upper power/ground pads 124 may correspond to those of second upper power/ground pads 224 corresponding to the first power/ground pads 124, and thus a detailed shape and arrangement of the first power/ground pads 124 will be discussed in detail below based on the second die 200.

The first die 100 may include external terminals 104. The external terminals 104 may be provided on the bottom surface of the first die 100. The external terminals 104 may be disposed below the first vias 110. Alternatively, first lower pads may be provided on the bottom surface of the first die 100, and the external terminals 104 may be disposed on the first lower pads. The external terminals 104 may be electrically connected to the first circuit layer 102 and the first vias 110.

Although not shown, the first die 100 may further include a passivation layer. The passivation layer (not shown) may be disposed on the bottom surface of the first die 100, covering the first circuit layer 102. The passivation layer (not shown) may protect the first circuit layer 102. The passivation layer (not shown) may include a silicon nitride (SiN) layer. The passivation layer (not shown) may expose the external terminals 104.

A die stack DS may be disposed on the first die 100. The die stack DS may include the second dies 200 stacked on the first die 100. The following will discuss a single second die 200 in describing configurations of the second dies 200.

The second die 200 may be provided. The second die 200 may include an electronic element such as a transistor. For example, the second die 200 may be a wafer-level semiconductor die formed of a semiconductor such as silicon (Si). The second die 200 may have a width less than that of the first die 100.

When viewed in a plan view, the second die 200 may have a signal region SR positioned on a central portion of the second die 200 and a peripheral region PR that surrounds the signal region SR. The signal region SR and the peripheral region PR of the second die 200 may respectively correspond to the signal region SR and the peripheral region PR of the first die 100. For example, the signal region SR and the peripheral region PR of the second die 200 may have shapes substantially the same as those of the signal region SR and the peripheral region PR of the first die 100 In this description below, sections of the second die 200 that are designated by the same terms used for corresponding sections of the first die 100 will indicate the same sections to which the corresponding sections of the first die 100 are projected.

The signal region SR may extend in the first direction D1. The signal region SR may be a section on which are provided wiring lines for signals that are processed in an integrated circuit within the second die 200. The peripheral region PR may be either a section on which are provided wiring lines for various signals (e.g., power signal and ground signal) for driving the integrated circuit in the second die 200 or a section on which are provided one or more thermal conductive members (e.g., dummy via or dummy solder) for externally transferring heat generated from the second die 200. The peripheral region PR may not include a wiring line electrically connected to the integrated circuit in the second die 200. The peripheral region PR may surround the signal region SR.

When viewed in a plan view, the peripheral regions PR may include first regions RG1 adjacent to corners of the second die 200 and second regions RG2 adjacent to lateral surfaces SS of the second die 200.

Each of the first regions RG1 may be disposed in contact with or adjacent to one of corners CN of the second die 200. In this case, the first regions RG1 may be connected to the signal region SR. For example, the first regions RG1 may be disposed between the signal region SR and the corners CN of the second die 200. In this case, the signal region SR and one of the first regions RG1 may be positioned along an imaginary line IL that links a center of the second die 200 to one of the corners CN.

The second regions RG2 may be disposed between neighboring first regions RG1. The second regions RG2 may be disposed between neighboring corners CN and adjacent to the lateral surfaces SS of the second die 200. For example, the second regions RG2 may be disposed between the signal region SR and the lateral surfaces SS of the second die 200. In this case, one of the first regions RG1, one of the second regions RG2, and another of the first regions RG1 may be disposed side by side along each of the lateral surfaces SS of the second die 200.

The second die 200 may include a second circuit layer 202 and second vias 210. An uppermost second die 200 of the die stack DS may not include the second vias 210.

The second circuit layer 202 may be provided on a bottom surface 200b of the second die 200. The second circuit layer 202 may include an integrated circuit. For example, the second circuit layer 202 may include a memory circuit, a logic circuit, or a combination thereof. The bottom surface 200b of the second die 200 may be, for example, an active surface of the second die 200.

The second vias 210 may penetrate the second die 200 in the third direction D3. The second vias 210 may be electrically connected to the second circuit layer 202. The second vias 210 and the first vias 110 may be substantially the same in terms of configuration and arrangement. The second vias 210 may include second signal vias 212 provided on the signal region SR and second power/ground vias 214 provided on the peripheral region PR. For example, when viewed in a plan view, an arrangement of the second signal vias 212 and the second power/ground vias 214 may be substantially the same as that of the first signal vias 112 and the first power/ground vias 114. An uppermost second die 200 of the die stack DS may not include the second vias 210.

The second signal vias 212 may be electrically connected to the integrated circuit of the second die 200. On the signal region SR, the second signal vias 212 may be arranged along the first direction D1 and the second direction D2. For example, the second signal vias 212 may be provided in a grid shape. Alternatively, the second signal vias 212 may be arranged in rows, which rows may be shifted from each other in the first direction D1 or the second direction D2. For example, the second signal vias 212 may be disposed in a zigzag shape along the first direction D1 or the second direction D2. For another example, the second signal vias 212 may be arranged in a honeycomb shape.

The second power/ground vias 214 may be electrically connected to a power or ground circuit of the second die 200. The second power/ground vias 214 may be electrically insulated from the second signal vias 212. On the peripheral region PR, the second power/ground vias 214 may be arranged along the first direction D1 and the second direction D2. For example, the second power/ground vias 214 may be provided in a grid shape. Alternatively, the second power/ground vias 214 may be arranged in rows, which rows may be shifted from each other in the first direction D1 or the second direction D2. For example, the second power/ground vias 214 may be disposed in a zigzag shape along the first direction D1 or the second direction D2. For another example, the second power/ground vias 214 may be arranged in a honeycomb shape.

The second die 200 may include second upper pads 220 disposed on a top surface 200a of the second die 200. The second upper pads 220 may include second upper signal pads 222 provided on the signal region SR and second upper power/ground pads 224 provided on the peripheral region PR. The uppermost second die 200 of the die stack DS may not include the second upper pads 220.

The second upper signal pads 222 may be correspondingly coupled to the second vias 210. For example, on the signal region SR, the second upper signal pads 222 may be coupled to the second signal vias 212. The second upper signal pads 222 may each have a circular planar shape. An arrangement of the second upper signal pads 222 may conform to that of the second vias 210. For example, the second upper signal pads 222 may be arranged along the first direction D1 and the second direction D2.

The second upper power/ground pads 224 may be correspondingly coupled to the second vias 210. For example, on the peripheral region PR, the second upper power/ground pads 224 may be coupled to the second power/ground vias 214. The second upper power/ground pads 224 may each have a circular planar shape. An arrangement of the second upper power/ground pads 224 may conform to that of the second power/ground vias 214. For example, the second upper power/ground pads 224 may be arranged along the first direction D and the second direction D2. According to some example embodiments, some of the second upper power/ground pads 224 may not be coupled to the second power/ground vias 214. For example, the some of the second upper power/ground pads 224 may be dummy pads for discharging heat generated from the second die 200. In this case, the some of the second upper power/ground pads 224 may be electrically insulated from the second vias 210. In addition, the second upper power/ground pads 224 may be electrically insulated from the second signal vias 212. The following will focus on the embodiment of FIG. 2. The second upper power/ground pads 224 may have a height substantially the same as that of the second upper signal pads 222.

The second upper power/ground pads 224 may include first sub-pad 224-1 provided on the first regions RG1 and second sub-pads 224-2 provided on the second regions RG2. The first sub-pads 224-1 may have a height substantially the same as that of the second sub-pads 224-2.

According to embodiments of inventive concepts, the arrangement of the second upper power/ground pads 224 may be appropriately designed in accordance with fluidity of an under-fill 300, and thus the under-fill 300 may be limited and/or prevented from excessively protruding onto the lateral surfaces SS of the second dies 200. A shape and arrangement of the second upper power/ground pads 224 will be discussed in detail with reference to FIGS. 2 and 3. In embodiments of inventive concepts, the planar arrangement of the second upper power/ground pads 224 may be substantially identical or similar to that of second lower power/ground pads 234 and that of second connection terminals 244, and for convenience of description, the reference numerals 224, 234, and 244 are concurrently assigned to indicate their allocated components in FIGS. 2 to 5.

Referring to FIGS. 2 and 3, the second upper pads 220 may have a density greater than that of any other component on the signal region SR. In this description, a density of pads or connection terminals provided on an arbitrary region is defined to refer to a value obtaining by dividing the number of the pads or the connection terminals by an area of the arbitrary region. For example, the second upper signal pads 222 may have a density greater than that of the second upper power/ground pads 224. Therefore, a sum of areas of top surfaces of the second upper signal pads 222 per unit area on the signal region SR may be greater than that of areas of top surfaces of the second upper power/ground pads 224 per unit area on the peripheral region PR.

A high density may be given to the second upper signal pads 222 connected to wiring lines for signals that are processed in the integrated circuit of the second die 200. Therefore, the second die 200 may have high integration of wiring lines therein, and heat generated from the integrated circuit may be easily discharged through the second upper signal pads 222 and the second signal vias 212.

In contrast, a relatively low density may be given to the second upper power/ground pads 224 connected to wiring lines for various signals required to drive the integrated circuit. Therefore, a space between the second upper power/ground pads 224 may be wider than that between the second upper signal pads 222.

On the peripheral region PR, the arrangement of the second upper power/ground pads 224 on the first regions RG1 may be different from the arrangement of the second upper power/ground pads 224 on the second regions RG2.

The first sub-pads 224-1 on the first regions RG1 may have a density greater than that of the second sub-pads 224-2 on the second regions RG2. For example, a sum of areas of top surfaces of the first sub-pads 224-1 per unit area on the first regions RG1 may be greater than that of areas of top surfaces of the second sub-pads 224-2 per unit area on the second regions RG2. For example, the first sub-pads 224-1 may each have a first width w1 substantially the same as or similar to a second width w2 of each of the second sub-pads 224-2. In addition, a first arrangement period p1 of the first sub-pads 224-1 may be less than a second arrangement period p2 of the second sub-pads 224-2. For example, the number of the first sub-pads 224-1 per unit area on the first regions RG1 may be greater than that of the second sub-pads 224-2 per unit area on the second regions RG2. Therefore, a space between the first sub-pads 224-1 may be narrower than that between the second sub-pads 224-2. In this case, the number of the second upper power/ground pads 224 per unit area on the peripheral region PR may decrease with increasing distance from the corners CN of the second die 200 along the lateral surfaces SS of the second die 200. Alternatively, the number of the second upper power/ground pads 224 per unit area on the peripheral region PR may decrease with increasing distance from the imaginary line IL that links the center of the second die 200 to one of the corners CN.

According to some example embodiments, a structure of the second upper power/ground pads 224 may be appropriately designed in accordance with fluidity of the under-fill 300, and thus the under-fill 300 may be limited and/or prevented from excessively protruding onto the lateral surfaces SS of the second dies 200. A shape and arrangement of the second upper power/ground pads 224 will be discussed in detail with reference to FIGS. 4 and 5.

On the peripheral region RP, the shape of the second upper power/ground pads 224 on the first regions RG1 may be different from the shape of the second upper power/ground pads 224 on the second regions RG2.

The second upper power/ground pads 224 may be provided to have a uniform density on the peripheral region PR, and areas of top surfaces of the first sub-pads 224-1 on the first regions RG1 may be greater than those of top surfaces of the second sub-pads 224-2 on the second regions RG2. For example, the area of the top surface of each first sub-pad 224-1 may be greater than that of the top surface of each second sub-pad 224-2. Therefore, a sum of the areas of the top surfaces of the first sub-pads 224-1 per unit area on the first regions RG1 may be greater than that of the areas of the top surfaces of the second sub-pads 224-2 per unit area on the second regions RG2. For example, the first sub-pads 224-1 may each have a first width w1 greater than a second width w2 of each of the second sub-pads 224-2. In addition, a first arrangement period p1 of the first sub-pads 224-1 may be substantially the same as a second arrangement period p2 of the second sub-pads 224-2. Therefore, a space between the first sub-pads 224-1 may be narrower than that between the second sub-pads 224-2. A space between the second upper power/ground pads 224 may be a flow path through which a material flows to form the under-fill 300 during fabrication of the semiconductor package.

According to some example embodiments of inventive concepts, on the peripheral region PR, the second upper power/ground pads 224 may be more densely provided on the first regions RG1 adjacent to the corners CN of the second die 200 and the under-fill 300 may not excessively protrude onto the lateral surfaces SS of the second die 200 during its mounting. This will be discussed in detail below together with a method of fabricating a semiconductor package according to some example embodiments of inventive concepts.

The following will focus on the embodiment of FIGS. 2 and 3.

Referring back to FIGS. 1 to 3, the first width w1 of each of the first sub-pads 224-1 may be the same as or less than a third width w3 of each of the second upper signal pads 222. The first arrangement period p1 of the first sub-pads 224-1 may be substantially the same as a third arrangement period p3 of the second upper signal pads 222. Inventive concepts, however, are not limited thereto. The first width w1 and the first arrangement period p1 of the first sub-pads 224-1 may be less than, greater than, identical to, or similar to the third width w3 and the third arrangement period p3 of the second upper signal pads 222.

The second die 200 may include second lower pads 230 disposed on the bottom surface 200b of the second die 200. The second lower pads 230 may include second lower signal pads 232 provided on the signal region SR and second lower power/ground pads 234 provided on the peripheral region PR.

The second lower signal pads 232 may be coupled to the second circuit layer 202 or corresponding second signal vias 212. The second lower signal pads 232 may each have a circular planar shape. An arrangement of the second lower signal pads 232 may conform to that of the second upper signal pads 222 of the second die 200 disposed below the second lower signal pads 232. For example, the second lower signal pads 232 may be arranged along the first direction D1 and the second direction D2.

The second lower power/ground pads 234 may be provided on the peripheral region PR and coupled to the second power/ground vias 214. In addition, the second lower power/ground pads 234 may be electrically insulated from the first signal vias 112. A planar shape and arrangement of the second lower power/ground pads 234 may conform to those of the second upper power/ground pads 224 of the second die 200 that are disposed below the second lower power/ground pads 234. For example, an arrangement or shape of the second lower power/ground pads 234 on the first regions RG1 may be different from an arrangement or shape of the second lower power/ground pads 234 on the second regions RG2. For example, the second lower power/ground pads 234 may include third sub-pads 234-1 provided on the first regions RG1 and fourth sub-pads 234-2 provided on the second regions RG2. As shown in FIGS. 2 and 3, the third sub-pads 234-1 on the first regions RG1 may be provided to have a density greater than that of the fourth sub-pads 234-2 on the second regions RG2. Alternatively, as shown in FIGS. 4 and 5, a planar area of each of the third sub-pads 234-1 on the first regions RG1 may be greater than that of each of the fourth sub-pads 234-2 on the second regions RG2.

FIG. 1 shows bottom surfaces of the second lower pads 230 are coplanar with the bottom surface 200b of the second die 200, but inventive concepts are not limited thereto. The second lower pads 230 may protrude onto the bottom surface 200b of the second die 200.

Neighboring second dies 200 may be connected to each other through the connection terminals 240. For example, on the signal region SR, the second upper signal pads 222 may be connected through first connection terminals 242 to the second lower signal pads 232 that face the second upper signal pads 222. On the peripheral region PR, the second upper power/ground pads 224 may be connected through second connection terminals 244 to the second lower power/ground pads 234 that face the second upper power/ground pads 224. The second dies 200 may be electrically connected to each other through the second upper signal pads 222, the first connection terminals 242, and the second lower signal pads 232. The second dies 200 may receive various signals (e.g., power signal or ground signal) for driving the integrated circuit in the second die 200 through the second upper power/ground pads 224, the second connection terminals 244, and the second lower power/ground pads 234. The connection terminals 240 may include solder balls or solder bumps. The first connection terminals 242 may be provided to have a high density on the signal region SR.

A planar shape and arrangement of the second connection terminals 244 may conform to those of the second upper power/ground pads 224 and those of the second lower power/ground pads 234. For example, the second connection terminals 244 may be provided to have a density that is greater on the first regions RG1 than on the second regions RG2, or may be provided to have a planar area that is greater on the first regions RG1 than on the second regions RG2. For example, the second connection terminals 244 may include first sub-connection terminals 244-1 by which the first sub-pads 224-1 and the third sub-pads 234-1 are connected on the first regions RG1, and may also include second sub-connection terminals 244-2 by which the second sub-pads 224-2 and the fourth sub-pads 234-2 are connection on the second regions RG2. A sum of planar areas of the first sub-connection terminals 244-1 per unit area may be greater than that of planar areas of the second sub-connection terminals 244-2 per unit area.

According to some example embodiments, as shown in FIGS. 2 and 3, the first sub-connection terminals 244-1 and the second sub-connection terminals 244-2 may have substantially planar shape, and the first sub-connection terminals 244-1 on the first regions RG1 may have a density greater than that of the second sub-connection terminals 244-2 on the second regions RG2. For example, the number of the first sub-connection terminals 244-1 per unit area may be greater than that of the second sub-connection terminals 244-2 per unit area. In this case, the number of the second sub-connection terminals 244-2 per unit area on the peripheral region PR may decrease with increasing distance from the corners CN of the second die 200 along the lateral surfaces SS of the second die 200. Therefore, the number of the second sub-connection terminals 244-2 per unit area may be a minimum on an intermediate location between two neighboring corners CN of the second die 200, or at a center of the lateral surfaces SS of the second die 200. Alternatively, the number of the second sub-connection terminals 244-2 per unit area on the peripheral region PR may decrease with increasing distance from the imaginary line IL that links the center of the second die 200 to one of the corners CN. In this case, an interval between neighboring second sub-connection terminals 244-2 may be about 2 times to about 5 times that between neighboring first sub-connection terminals 244-1.

According to some example embodiments, as shown in FIGS. 4 and 5, the first sub-connection terminals 244-1 and the second sub-connection terminals 244-2 may have the same or similar periods, and a top surface of each of the first sub-connection terminals 244-1 may have an area greater than that of a top surface of each of the second sub-connection terminals 244-2.

On the peripheral region PR, the second connection terminals 244 may be more densely provided on the first regions RG1 adjacent to the corners CN of the second die 200, and thus a space between the second connection terminals 244 may be narrower on the first regions RG1 than on the second regions RG2. A space between the connection terminals 240 may be a flow path through which a material flows to form the under-fill 300 during fabrication of the semiconductor package. Therefore, on the second regions RG2, the under-fill 300 may have an increased volume to fill a space between the second connection terminals 244, and when the second die 200 undergoes a thermocompression process, the material forming the under-fill 300 may be limited and/or prevented from excessively protruding onto the lateral surfaces SS of the second die 200. This will be discussed in detail below together with a method of fabricating a semiconductor package according to some example embodiments of inventive concepts.

According to some example embodiments of inventive concepts, the under-fill 300 may be limited and/or prevented from protruding onto the lateral surfaces SS of the second die 200 and from colliding against the second die 200 adjacent to the under-fill 300, and therefore the second die 200 may be limited and/or prevented from being damaged due to the under-fill 300 or from being delaminated from a neighboring second die 200. Thus, the semiconductor package may be provided to have improved structural stability.

Similar to the first connection terminals 242, the first sub-connection terminals 244-1 may be provided to have a high density on the first regions RG1. For example, a sum of planar areas of the first sub-connection terminals 244-1 per unit area on the first regions RG1 may be about 0.8 times to about 1.2 times a sum of planar areas of the first connection terminals 242 per unit area on the signal region SR.

The first sub-connection terminals 244-1 may have the same height as that of the second sub-connection terminals 244-2. For example, there may be provided a substantially constant interval between a gap between the second dies 200 that face each other, or between the second upper power/ground pads 224 and the second lower power/ground pads 234 that face the second upper power/ground pads 224.

FIG. 2 shows that the first regions RG1 have their rectangular shapes, but inventive concepts are not limited thereto. The first regions RG1 and the second regions RG2 may be provided to have their shapes that are variously changed in accordance with flow directions of the material that forms the under-fill 300.

Figure 6:
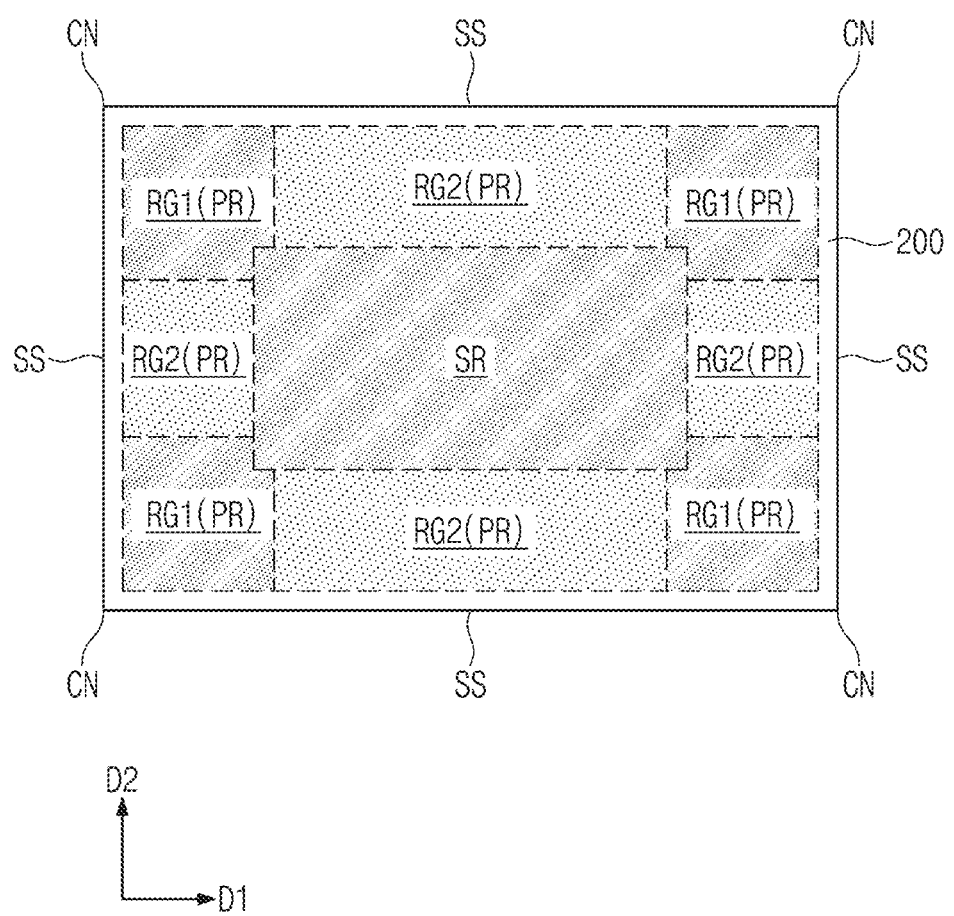
FIGS. 6 to 8 illustrate simplified plan views showing regions of semiconductor dies in a semiconductor package according to some example embodiments of inventive concepts.
Figure 7:
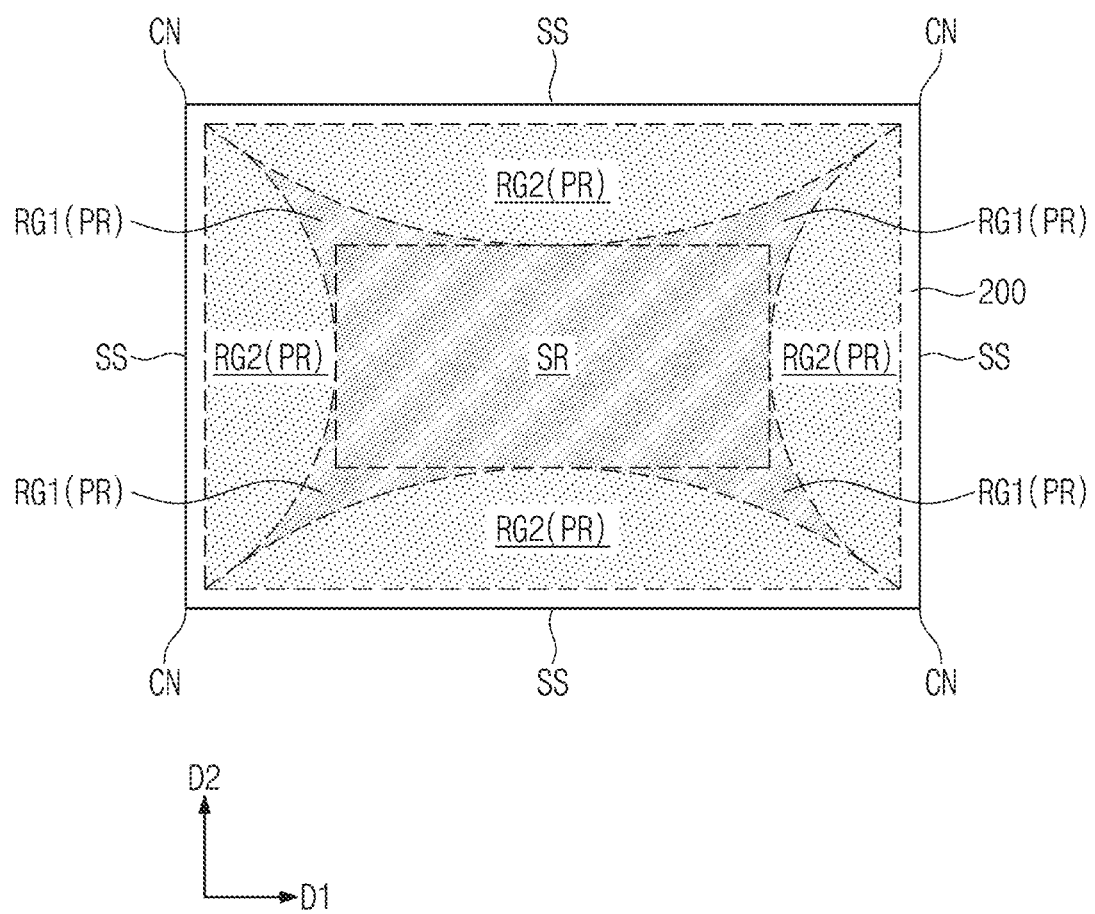
Figure 8:
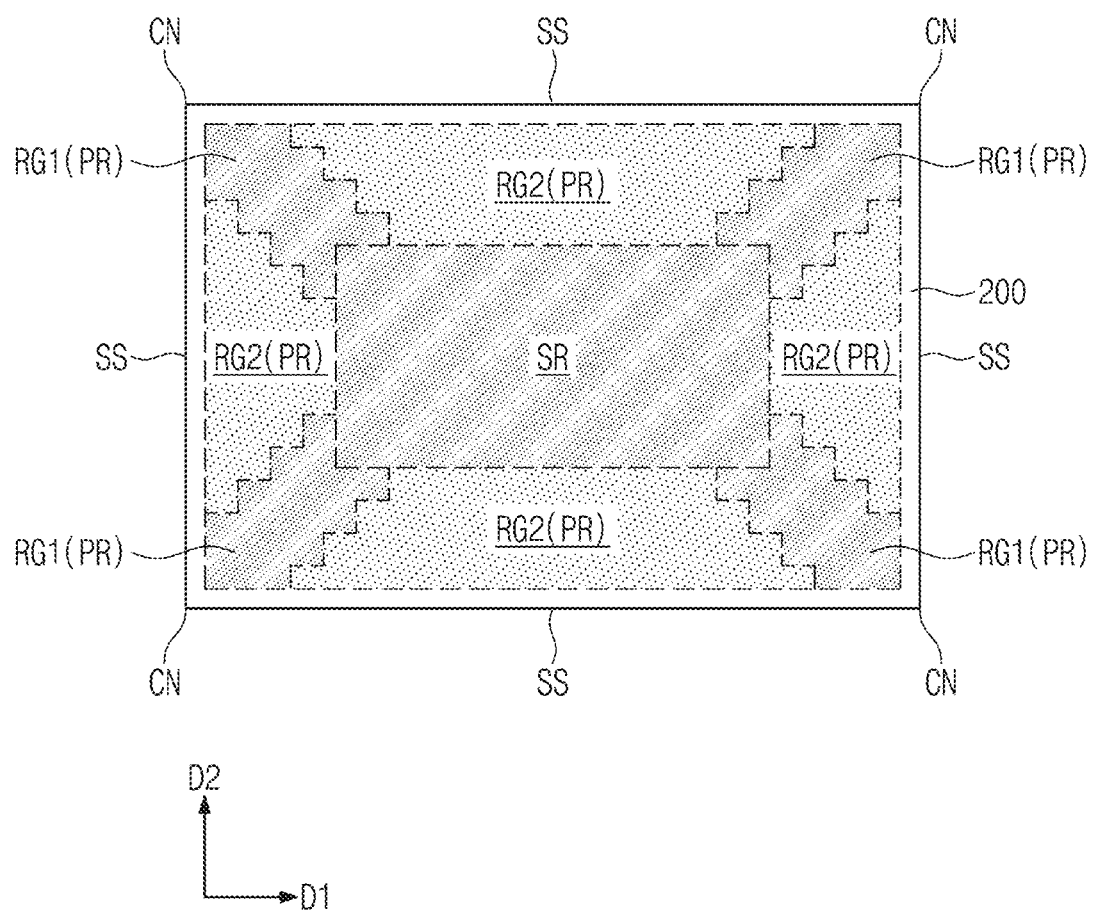

FIGS. 6 to 8 illustrate simplified plan views showing regions of semiconductor dies in a semiconductor package according to some example embodiments of inventive concepts. For convenience of description, FIGS. 6 to 8 omit the illustration of components other than the first and second regions RG1 and RG2 of the second die 200.

As shown in FIG. 6, the first regions RG2 may each have a tetragonal planar shape. Each of the first regions RG1 may be disposed adjacent to one of the corners CN of the second die 200 and aligned with the lateral surfaces SS of the second die 200 that are adjacent to the corners CN. The first regions RG1 may partially overlap the signal region SR. In this case, the first regions RG1 may be connected to the signal region SR. For example, a section (e.g., the signal region SR or the first regions RG1) where the connection terminals 240 are densely disposed may be placed on the center of the second die 200 or on a location directed toward the corners CN from the center of the second die 200.

In the embodiment of FIG. 6, each of the signal region SR and the second regions RG2 may have a tetragonal planar shape. In this case, the signal region SR, the first regions RG1, and the second regions RG2 may their planar shapes with the same axis. For example, one surface of the signal region SR may be parallel to those of the first regions RG1 and those of the second regions RG2. The configuration may assist to establish an easy arrangement of the connection terminals 240 provided on each of the regions SR, RG1, and RG2, and the connection terminals 240 may be arranged in the same direction (e.g., the first direction D1 and the second direction D2) on each of the regions SR, RG1, and RG2. Therefore, the connection terminals 240 may be more densely arranged, and the second die 200 may have high integration of wiring lines.

As shown in FIG. 7, on the signal region SR, the first regions RG1 may each have a linear shape that extends toward the corners CN of the second die 200. For example, the first regions RG1 may each have a width that decreases in a direction from the signal region SR toward the corners CN of the second die 200. In this case, the first regions RG1 may each have a wedge shape with a tip directed toward the corners CN of the second die 200.

Based on planar shapes of the first regions RG1, a width of the second regions RG2 positioned between neighboring first regions RG1 may decrease in a direction toward the corners CN of the second die 200 from an intermediate location of the lateral surfaces SS of the second die 200. In this case, the second connection terminals 244 may have a density that increases in a direction toward the corners CN of the second die 200 from the intermediate location of the lateral surfaces SS of the second die 200. For example, on the peripheral region PR, the second connection terminals 244 may have a minimum density on the intermediate location of the lateral surfaces SS of the second die 200 and may have a maximum density on a location around the corners CN of the second die 200.

In the embodiment of FIG. 7, sections (e.g., the signal region SR and the first regions RG1) on each of which the connection terminals 240 are densely arranged may be provided to have their widths each of which decreases in a direction from the center of the second die 200 toward the corners CN of the second die 200. Therefore, when the second die 200 undergoes a thermocompression process, a flux of the material that forms the under-fill 300 may be uniform regardless of position on the lateral surfaces SS of the second die 200. This will be discussed in detail in a method of fabricating the semiconductor package.

According to some example embodiments, as shown in FIG. 8, the first regions RG1 may have their linear shapes that extend from the signal region SR toward the corners CN of the second die 200, and boundaries between the first regions RG1 and the second regions RG2 may each have a stepwise shape when viewed in a plan view. This may allow the boundaries between the first regions RG1 and the second regions RG2 to become parallel to an arrangement direction of the connection terminals 240 (e.g., to the first direction D1 and the second direction D2), and therefore the connection terminals 240 may be densely arranged and easily disposed on each of the regions SR, RG1, and RG2, and the second die 200 may have high integration of wiring lines.

Referring back to FIGS. 1 to 3, the die stack DS and the first die 100 may constitute a chip-on-wafer (COW) structure. For example, the connection terminals 240 may be attached onto the bottom surface 200b of a lowermost second die 200, and the second die 200 may face down to allow the bottom surface 200b of the second die 200 to face toward the top surface of the first die 100. The lowermost second die 200 may be mounted on the first die 100 through the connection terminals 240 provided on the second lower pads 230. The connection terminals 240 may connect the first upper pads 120 of the first die 100 to the second lower pads 230 of the second die 200.

The under-fill 300 may be provided between the second dies 200 and/or between the die stack DS and the first die 100. The under-fill 300 may include a non-conductive film (NCF). For example, the under-fill 300 may be a polymer tape including a dielectric material. Alternatively, the under-fill 300 may include a fluidic adhesive member. The under-fill 300 may be interposed between the connection terminals 240, and thus an electrical short may be limited and/or prevented between the connection terminals 240. The under-fill 300 may have an outer lateral surface substantially parallel to the lateral surfaces SS of the second dies 200. The under-fill 300 may have a planar shape the same as or similar to those of the second dies 200. For example, the second dies 200 may each have a rectangular planar shape whose lateral surfaces SS are directed toward in the first direction D1 and the second direction D2, and the under-fill 300 may have a rectangular planar shape whose lateral surfaces SS are directed toward in the first direction D1 and the second direction D2. In some example embodiments, the under-fill 300 may have rounded corners. Inventive concepts, however, are not limited thereto. The under-fill 300 may partially protrude onto the lateral surfaces SS of the second dies 200. In this case, the under-fill 300 may have a substantially constant distance from the lateral surfaces SS of the second dies 200.

According to some example embodiments of inventive concepts, the under-fill 300 may entirely cover the bottom surfaces 200b of the second dies 200 in accordance with planar shapes of the second dies 200. Therefore, it may be limited and/or prevented that the connection terminals 240 are not protected around the corners CN because the under-fill 300 does not fill on the corners CN of the second dies 200, or that the under-fill 300 excessively protrudes onto the lateral surfaces SS of the second dies 200 to thereby collide with other second dies 200. This will be discussed in detail together with a method of fabricating a semiconductor package.

Referring back to FIGS. 1 and 2, a molding layer 400 may be disposed on the first die 100. The molding layer 400 may cover the top surface of the first die 100. When viewed in a plan view, the molding layer 400 may surround the die stack DS. The molding layer 400 may include a dielectric polymer material. For example, the molding layer 400 may include an epoxy molding compound (EMC).

Figure 9:
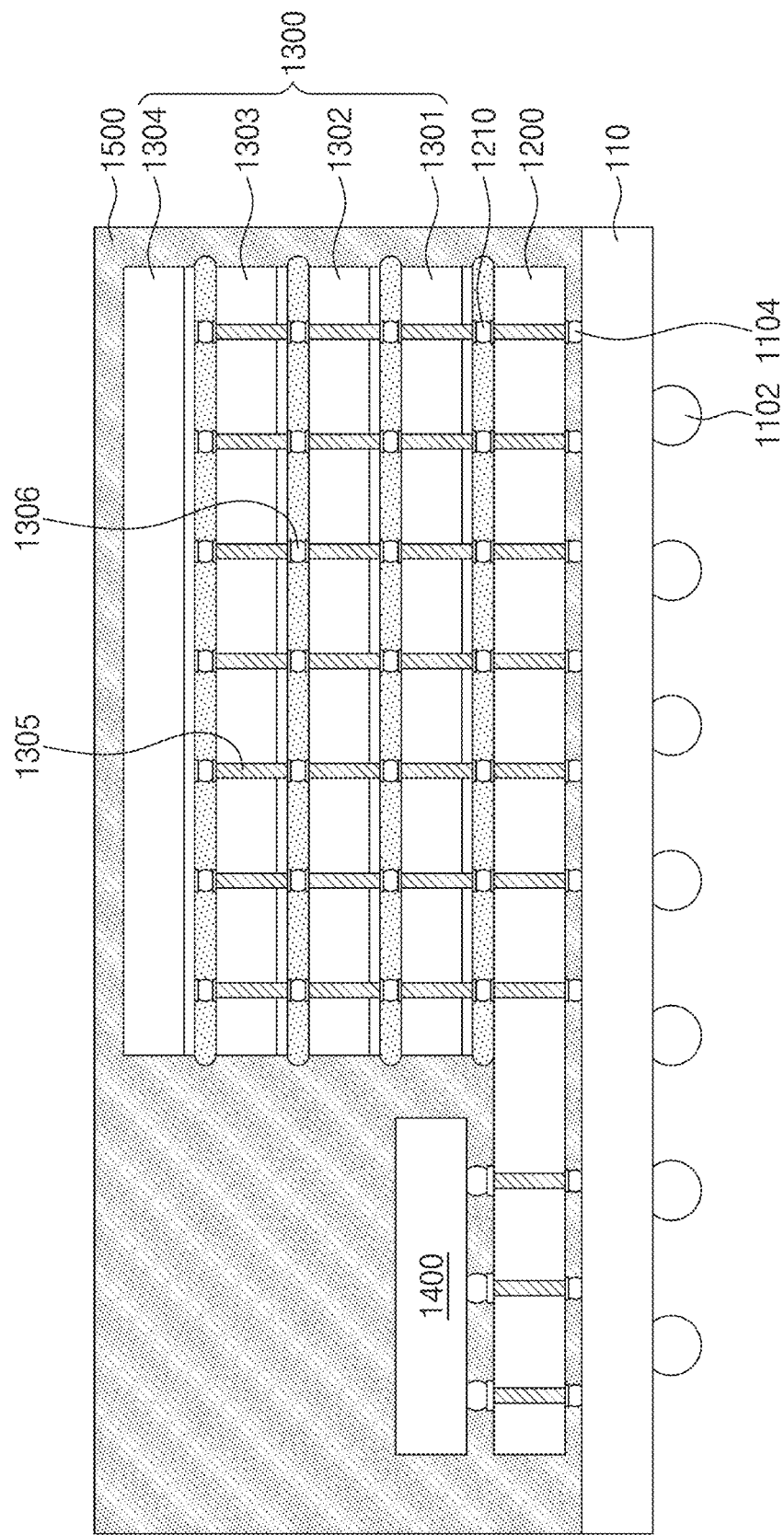
FIG. 9 illustrates a cross-sectional view showing a semiconductor module according to some example embodiments of inventive concepts.

FIG. 9 illustrates a cross-sectional view showing a semiconductor module according to some example embodiments of inventive concepts.

Referring to FIG. 9, a semiconductor module may be a memory module that includes a package substrate 1100 such as a printed circuit board having external terminals 1102 attached thereto, a chip stack 1300 and a graphic processing unit (GPU) 1400 that are mounted on the package substrate 1100, and a molding layer 1500 that covers the chip stack 1300 and the graphic processing unit 1400. The semiconductor module may further include an interposer 1200 provided on the package substrate 1100.

The graphic processing unit 1400 and the chip stack 1300 may be electrically connected to the interposer 1200 through solder balls 1210 disposed on the interposer 1200. The interposer 1200 may include through electrodes 1205 to electrically connect with the package substrate 1100 through solder balls 1104 disposed on the package substrate 1100.

The chip stack 1300 may include a plurality of high bandwidth memory chips 1301, 1302, 1303, and 1304 that are stacked. The memory chips 1301 to 1304 may comply with a High Bandwidth Memory (HBM) standard released by JEDEC (Joint Electron Device Engineering Council), as well as future evolutions/versions of HBM standards. The memory chips 1301, 1302, 1303, and 1304 may be electrically connected to each other through solder balls 1306. At least one selected from the memory chips 1301, 1302, 1303, and 1304 may include through electrodes 1305. For example, each of first, second, and third memory chips 1301, 1302, and 1303 may include at least one through electrode 1305. A fourth memory chip 1304 may include no through electrode. Alternatively, the fourth memory chip 1304 may include through electrodes 1305. The chip stack 1300 may have a structure identical or similar to that of the die stack DS depicted in FIGS. 1 to 8.

Alternatively, the interposer 1200 and the chip stack 1300 mounted on the interposer 1200 may each have a structure identical or similar to one of those of the semiconductor packages depicted in FIGS. 1 to 8. The description of the second die 200 of FIGS. 1 to 8, the pads 220 and 230 of the second die 200, and the connection terminals 240 of the second die 200 may be identically or similarly applicable to the first, second, third, and fourth memory chips 1301, 1302, 1303, and 1304 and their pads and solder balls 1306.

Figure 10:
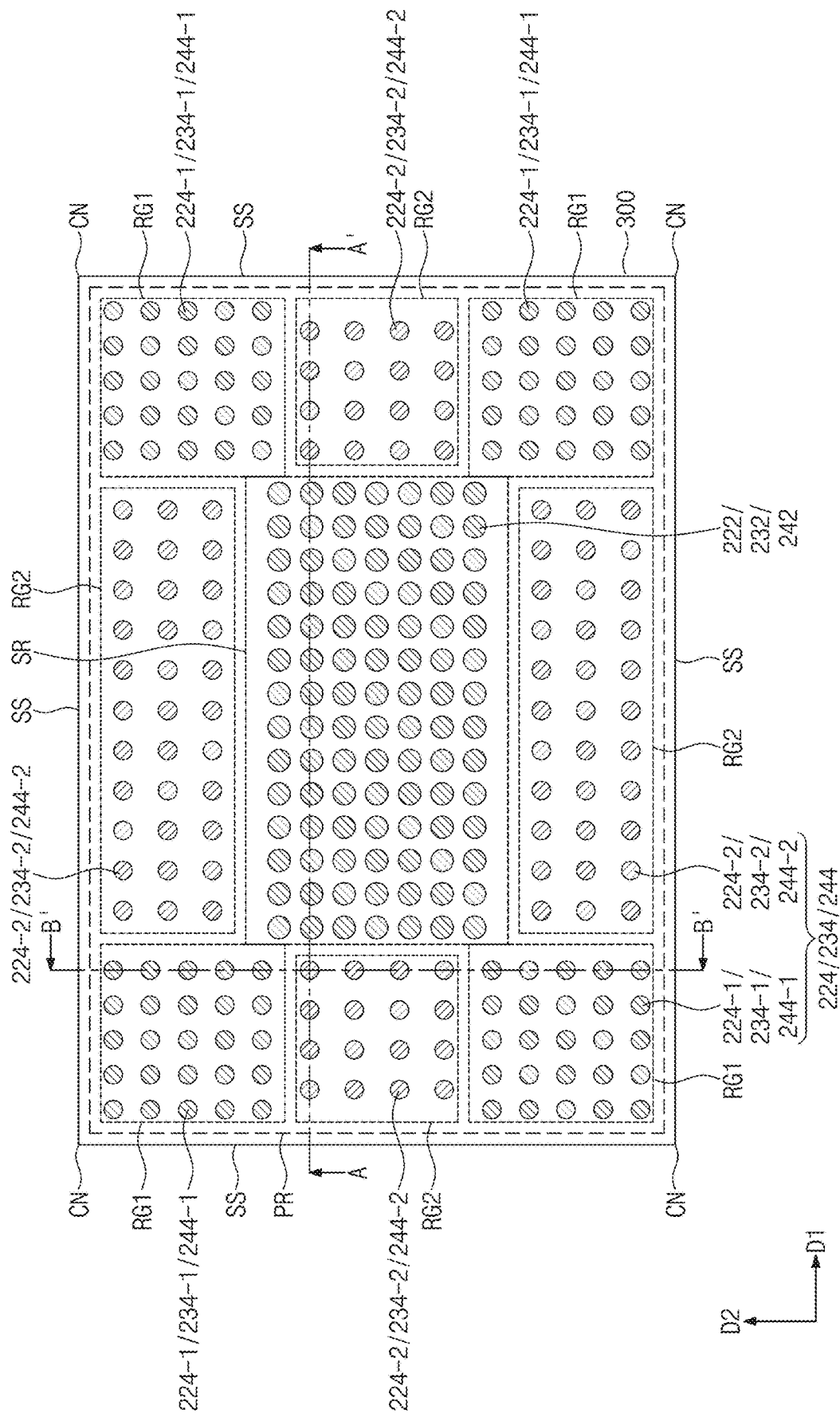
FIG. 10 illustrates a plan view showing a method of fabricating a semiconductor package according to some example embodiments of inventive concepts.

FIG. 10 illustrates a plan view showing a method of fabricating a semiconductor package according to some example embodiments of inventive concepts. FIGS. 11 to 15 illustrate cross-sectional views showing a method of fabricating a semiconductor package according to some example embodiments of inventive concepts. FIGS. 16 to 19 illustrate simplified plan views showing flows of an under-fill in a method of fabricating a semiconductor package according to some example embodiments of inventive concepts. FIG. 20 illustrates a cross-sectional view showing a method of fabricating a semiconductor package according to some example embodiments of inventive concepts. FIGS. 11 to 13, 15, and 20 correspond to cross-sections taken along line A-A' of FIG. 10. FIG. 14 corresponds to a cross-section taken along line B-B' of FIG. 10.

Figure 11:
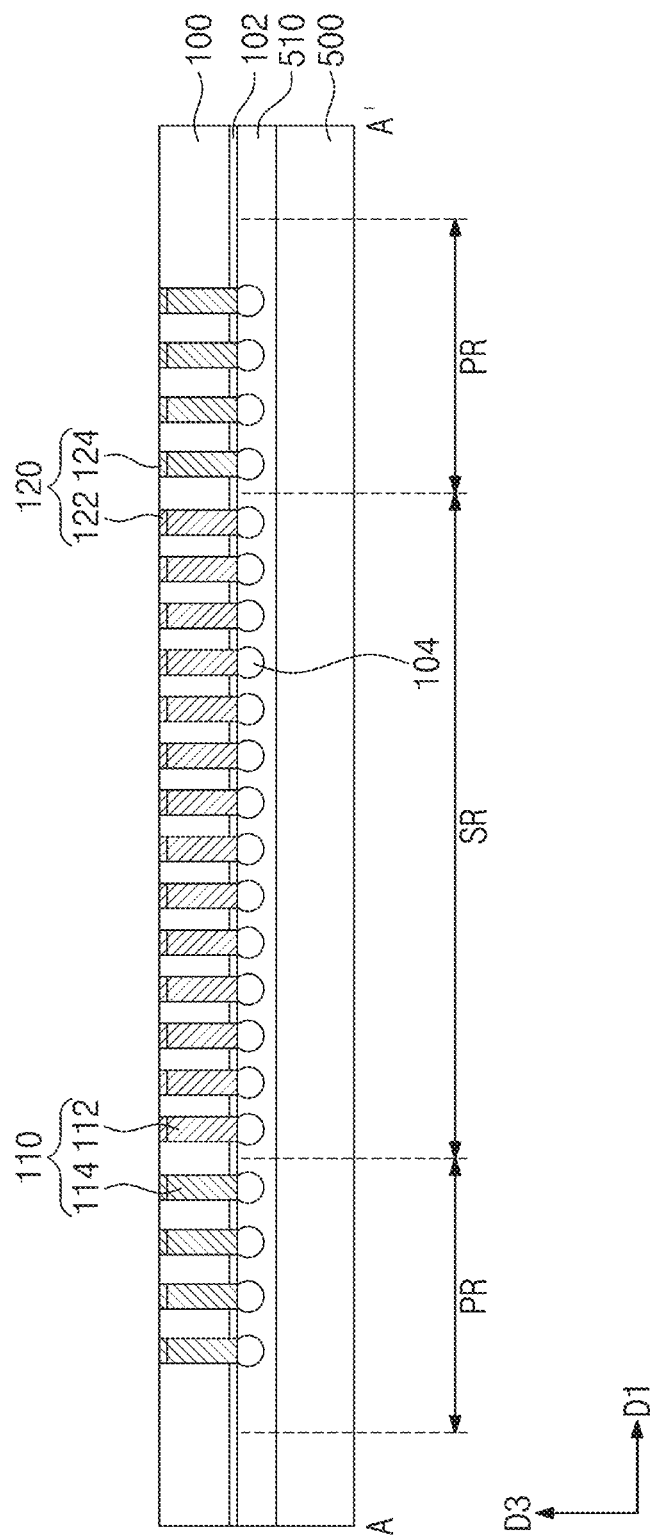
FIGS. 11 to 15 illustrate cross-sectional views showing a method of fabricating a semiconductor package according to some example embodiments of inventive concepts.

Referring to FIGS. 10 and 11, a base substrate 100 may be formed on a carrier substrate 500. For example, a carrier adhesion layer 510 may be provided to attach the base substrate 100 to the carrier substrate 500.

The base substrate 100 may include an integrated circuit therein. For example, the base substrate 100 may be a first die that includes an electronic element such as a transistor. For example, the base substrate 100 may be a wafer-level semiconductor die formed of a semiconductor such as silicon (Si). FIG. 11 shows that the base substrate 100 is a first die, but inventive concepts are not limited thereto. According to some example embodiments of inventive concepts, the base substrate 100 may not include an electronic element such as a transistor. The following will discuss an example in which the base substrate 100 and the first die are the same component.

The first die 100 may be the same as or similar to that discussed with reference to FIGS. 1 to 8. For example, when viewed in a plan view, the first die 100 may have a signal region SR positioned on a central portion of the first die 100 and a peripheral region PR that surrounds the signal region SR. The first die 100 may include a first circuit layer 102 and first vias 110. The first circuit layer 102 may be provided on a bottom surface of the first die 100. The bottom surface of the first die 100 may be an active surface of the first die 100. The first vias 110 may penetrate the first die 100 in a third direction D3 and may electrically connect with the first circuit layer 102. The first vias 110 may include first signal vias 112 provided on the signal region SR and first power/ground vias 114 provided on the peripheral region PR. The first die 100 may include first upper pads 120 disposed on a top surface of the first die 100. The first upper pads 120 may include first upper signal pads 122 provided on the signal region SR and first upper power/ground pads 124 provided on the peripheral region PR. The first upper signal pads 122 may be coupled to the first signal vias 112, and the first upper power/ground pads 124 may be coupled to the first power/ground vias 114.

The first die 100 may include external terminals 104. The external terminals 104 may be provided on the bottom surface of the first die 100. The external terminals 104 may be disposed below the first vias 110.

Figure 12:
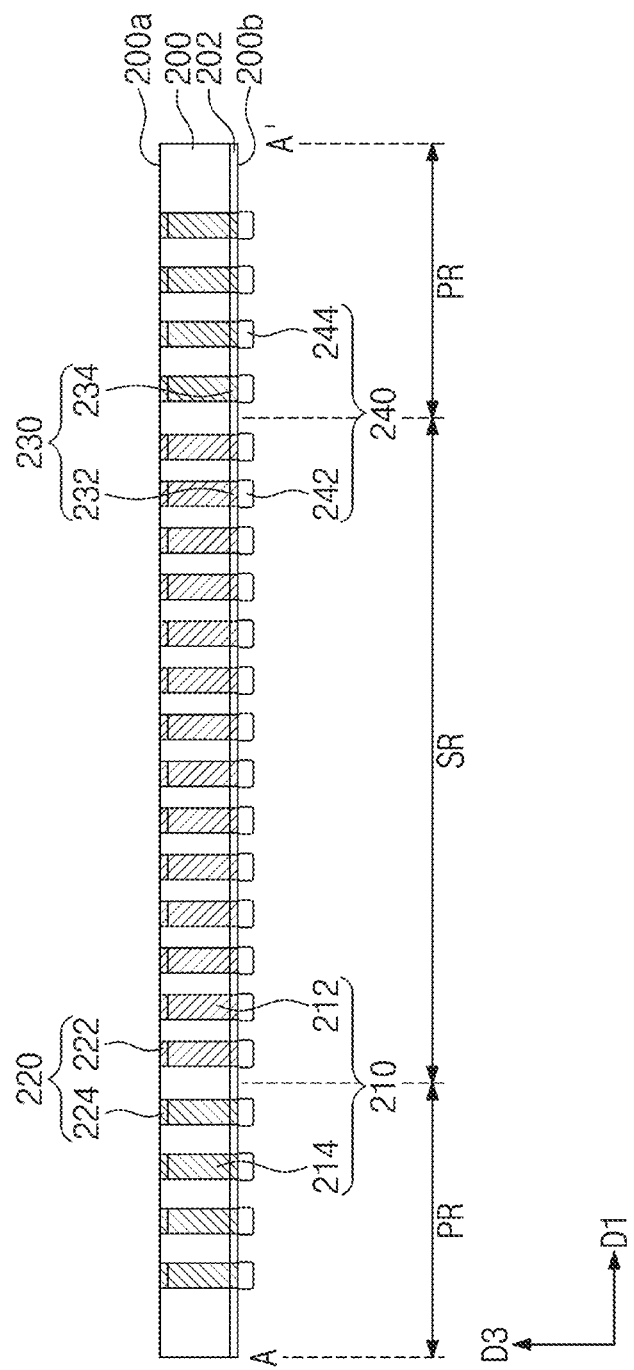

Referring to FIGS. 10 and 12, a second die 200 may be provided. The second die 200 may include an electronic element such as a transistor. For example, the second die 200 may be a wafer-level semiconductor die formed of a semiconductor such as silicon (Si). The second die 200 may have a width less than that of the first die 100.

The second die 200 may be the same as or similar to that discussed with reference to FIGS. 1 to 8. For example, when viewed in a plan view, the second die 200 may have a signal region SR positioned on a central portion of the second die 200 and a peripheral region PR that surrounds the signal region SR. The signal region SR and the peripheral region PR of the second die 200 may respectively correspond to the signal region SR and the peripheral region PR of the first die 100. The second die 200 may include a second circuit layer 202 and second vias 210. The second circuit layer 202 may be provided on a bottom surface 200b of the second die 200. The bottom surface 200b of the second die 200 may be an active surface of the second die 200. The second vias 210 may penetrate the second die 200 in the third direction D3 and may electrically connect with the second circuit layer 202. The second vias 210 may include second signal vias 212 provided on the signal region SR and second power/ground vias 214 provided on the peripheral region PR.

The second die 200 may include second upper pads 220 disposed on a top surface 200a of the second die 200. The second upper pads 220 may include second upper signal pads 222 provided on the signal region SR and second upper power/ground pads 224 provided on the peripheral region PR. The second upper signal pads 222 may be coupled to the second signal vias 212, and the second upper power/ground pads 224 may be coupled to the second power/ground vias 214.

When viewed in a plan view, the peripheral region PR may include first regions RG1 adjacent to corners CN of the second die 200 and second regions RG2 adjacent to lateral surfaces SS of the second die 200 between neighboring corners CN. The second upper power/ground pads 224 may include first sub-pads 224-1 provided on the first regions RG1 and second sub-pads 224-2 provided on the second regions RG2. A sum of areas of top surfaces of the first sub-pads 224-1 per unit area on the first regions RG1 may be greater than that of areas of top surfaces of the second sub-pads 224-2 per unit area on the second regions RG2.

The second die 200 may include second lower pads 230 disposed on the bottom surface 200b of the second die 200. The second lower pads 230 may include second lower signal pads 232 provided on the signal region SR and second lower power/ground pads 234 provided on the peripheral region PR.

The second lower power/ground pads 234 may be provided on the peripheral region PR and coupled to the second power/ground vias 214. A planar shape and arrangement of the second lower power/ground pads 234 may conform to those of the second upper power/ground pads 224 of the second die 200 that are disposed below the second lower power/ground pads 234. For example, as shown in FIG. 10, the second lower power/ground pads 234 may include third sub-pads 234-1 provided on the first regions RG1 and fourth sub-pads 234-2 provided on the second regions RG2. A density of the third sub-pads 234-1 on the first regions RG1 may be greater than that of the fourth sub-pads 234-2 on the second regions RG2. Alternatively, a planar area of each of the third sub-pads 234-1 on the first regions RG1 may be greater than that of each of the fourth sub-pads 234-2 on the second regions RG2.

The second die 200 may include connection terminals 240. The connection terminals 240 may be provided on the bottom surface 200b of the second die 200. The connection terminals 240 may be disposed below the second lower pads 230. The connection terminals 240 may include micro-bumps.

The connection terminals 240 may include first connection terminals 242 on the signal region SR and second connection terminals 244 on the peripheral region PR. The first connection terminals 242 may be provided to have a density greater than that of the second connection terminals 244. As shown in FIG. 10, the second connection terminals 244 may include first sub-connection terminals 244-1 provided on the third sub-pads 234-1 on the first regions RG1 and second sub-connection terminals 244-2 provided on the fourth sub-pads 234-2 on the second regions RG2. A sum of planar areas of the first sub-connection terminals 244-1 per unit area may be greater than that of planar areas of the second sub-connection terminals 244-2 per unit area. For example, the first sub-connection terminals 244-1 may be provided to have a density greater than that of the second sub-connection terminals 244-2. Therefore, a space between the first sub-connection terminals 244-1 may be narrower than that between the second sub-connection terminals 244-2.

Figure 13:
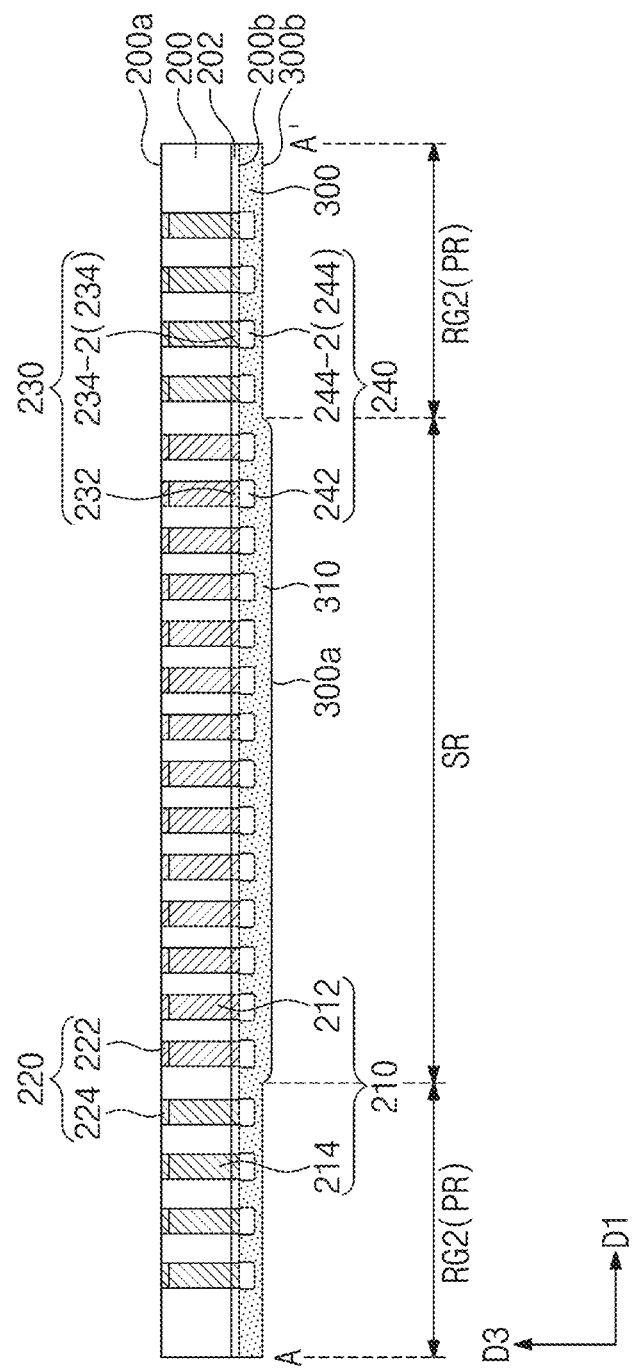
Figure 14:
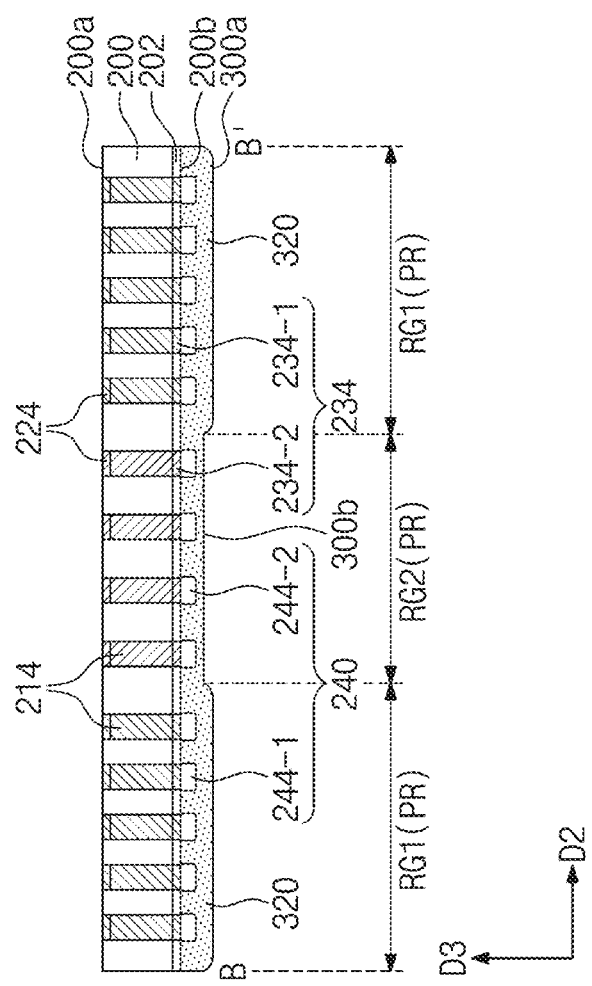

Referring to FIGS. 10, 13, and 14, an under-fill 300 may be provided below the second die 200. The under-fill 300 may include a non-conductive film (NCF). For example, the under-fill 300 may be a polymer tape including a dielectric material. The film-type under-fill 300 may be attached onto the bottom surface 200b of the second die 200. The connection terminals 240 may be inserted into the under-fill 300. For example, the under-fill 300 may bury the connection terminals 240 on the bottom surface 200b of the second die 200. In this case, on the signal region SR and the first regions RG1, the under-fill 300 may protrude downwardly from the second die 200. For example, the under-fill 300 on the signal region SR and the first regions RG1 may have a first bottom surface 300a located at a level lower than that of a second bottom surface 300b of the under-fill 300 on the second regions RG2. Thus, a distance between the bottom surface 200b of the second die 200 and the first bottom surface 300a of the under-fill 300 on the signal region SR and the first regions RG1 may be greater than that between the bottom surface 200b of the second die 200 and the second bottom surface 300b of the under-fill 300 on the second regions RG2. The under-fill 300 on the signal region SR and the first regions RG1 may have a thickness 2 times to 5 times that of the under-fill 300 on the second regions RG2. This difference in thickness may depend on the fact that spaces between the connection terminals 240 are different based on position. For example, there may be a large amount of residue of the under-fill 300 that fills a space between the connection terminals 240 on the signal region SR and the first regions RG1 that have a narrow space between the connection terminals 240, and there may be a large amount of the under-fill 300 accumulated on the connection terminals 240 on the signal region SR and the first regions RG1. There may be a small amount of residue of the under-fill 300 that fills a space between the connection terminals 240 on the second regions RG2 that have a wide space between the connection terminals 240, and there may be a small amount of the under-fill 300 accumulated on the connection terminals 240 on the second regions RG2. For convenience of description, a first accumulation 310 may indicate a portion of the under-fill 300 accumulated on the connection terminals 240 on the signal region SR, and a second accumulation 320 may indicate another portion of the under-fill 300 accumulated on the connection terminals 240 on the first regions RG1.

Figure 15:
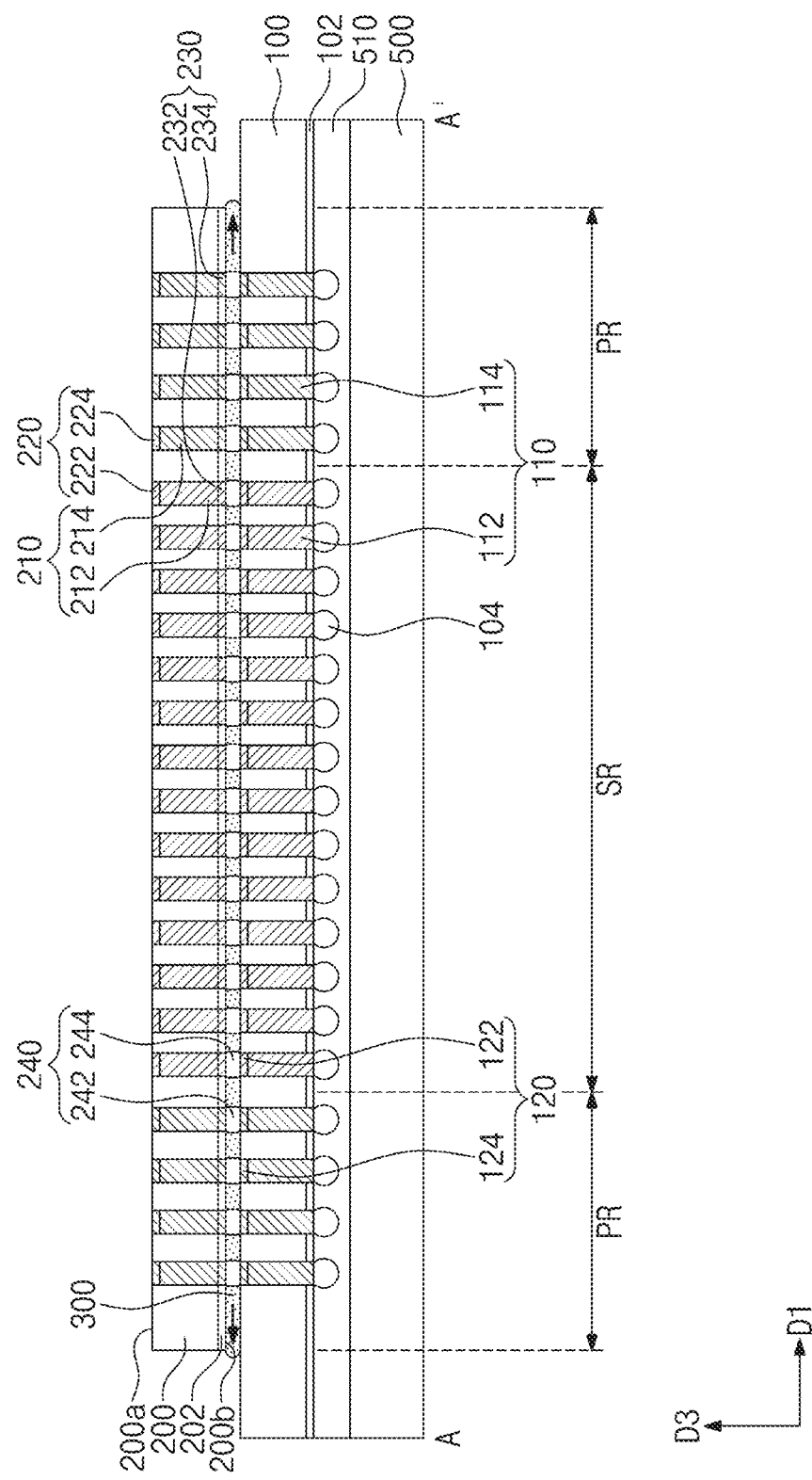

Referring to FIGS. 10 and 15, the second die 200 may be mounted on the first die 100. For example, the second die 200 and the first die 100 may constitute a chip-on-wafer (COW) structure. For example, the connection terminals 240 may be attached onto the bottom surface 200b of the second die 200, and the second die 200 may face down to allow the bottom surface 200b of the second die 200 to face toward the top surface of the first die 100. The second die 200 may be aligned on the first die 100 so as to allow the connection terminals 240 to lie between the first upper pads 120 and the second lower pads 230.

Afterwards, a reflow process may be performed on the connection terminals 240. Therefore, the connection terminals 240 may connect the first upper pads 120 to the second lower pads 230. For example, the first connection terminals 242 may connect the first upper signal pads 122 to the second lower signal pads 232, and the second connection terminals 244 may connect the first upper power/ground pads 124 to the second lower power/ground pads 234. The reflow process may include a thermocompression process. Heat and pressure provided in the reflow process may cause the under-fill 300 to flow between the first die 100 and the second die 200. For example, as indicated by arrows shown in FIG. 15, the under-fill 300 may flow outwardly from a central portion of the second die 200. The under-fill 300 may fill a space between the first die 100 and the second die 200.

The connection terminals 240 may be provided to have a density that is different based on their position between the first die 100 and the second die 200, and a flow direction of the under-fill 300 may be varied at each position. In this case, at a position where the under-fill 300 has a low flux, the under-fill 300 may not fully fill a space between the first die 100 and the second die 200 or a void may be generated in the under-fill 300. Alternatively, at a position where the under-fill 300 has a large flux, the under-fill 300 may protrude outwardly from one side of the second die 200 to thereby collide with another second die 200, and this may induce a delamination or short between the second dies 200. According to some example embodiments of inventive concepts, a flow of the under-fill 300 may be controlled by using a density of the connection terminals 240 between the first die 100 and the second die 200.

Figure 16:
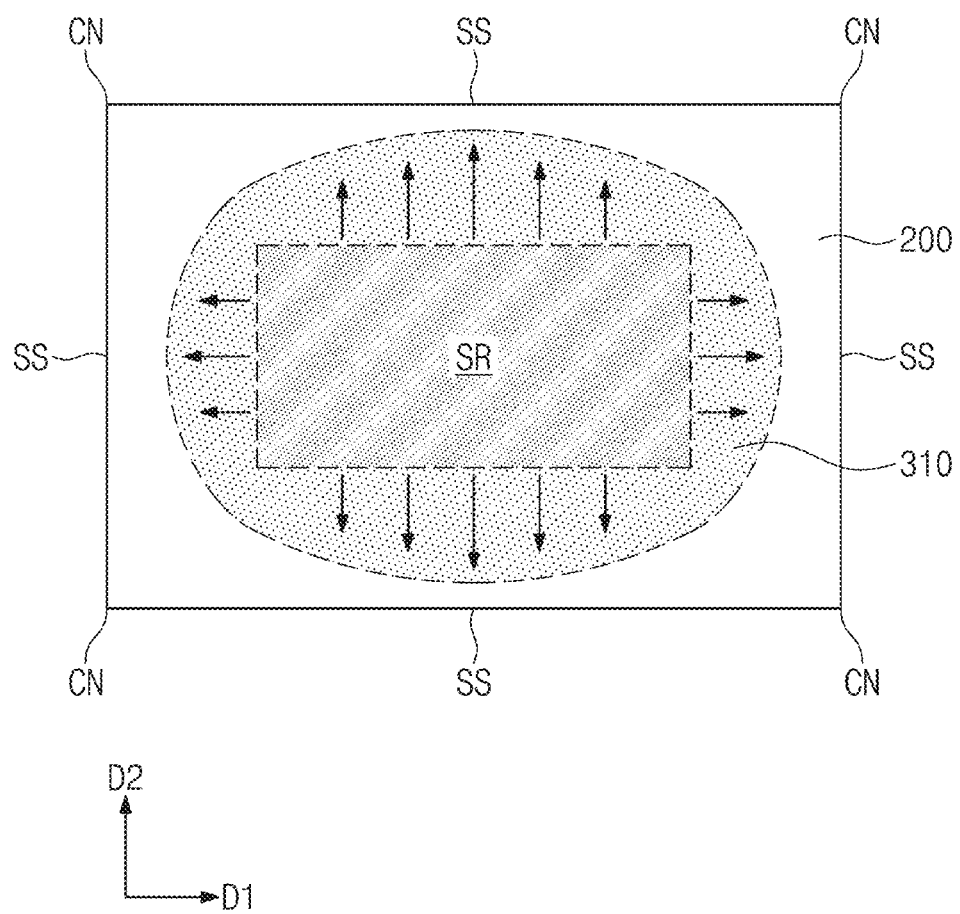
FIGS. 16 to 19 illustrate simplified plan views showing flows of an under-fill in a method of fabricating a semiconductor package according to some example embodiments of inventive concepts.
Figure 17:
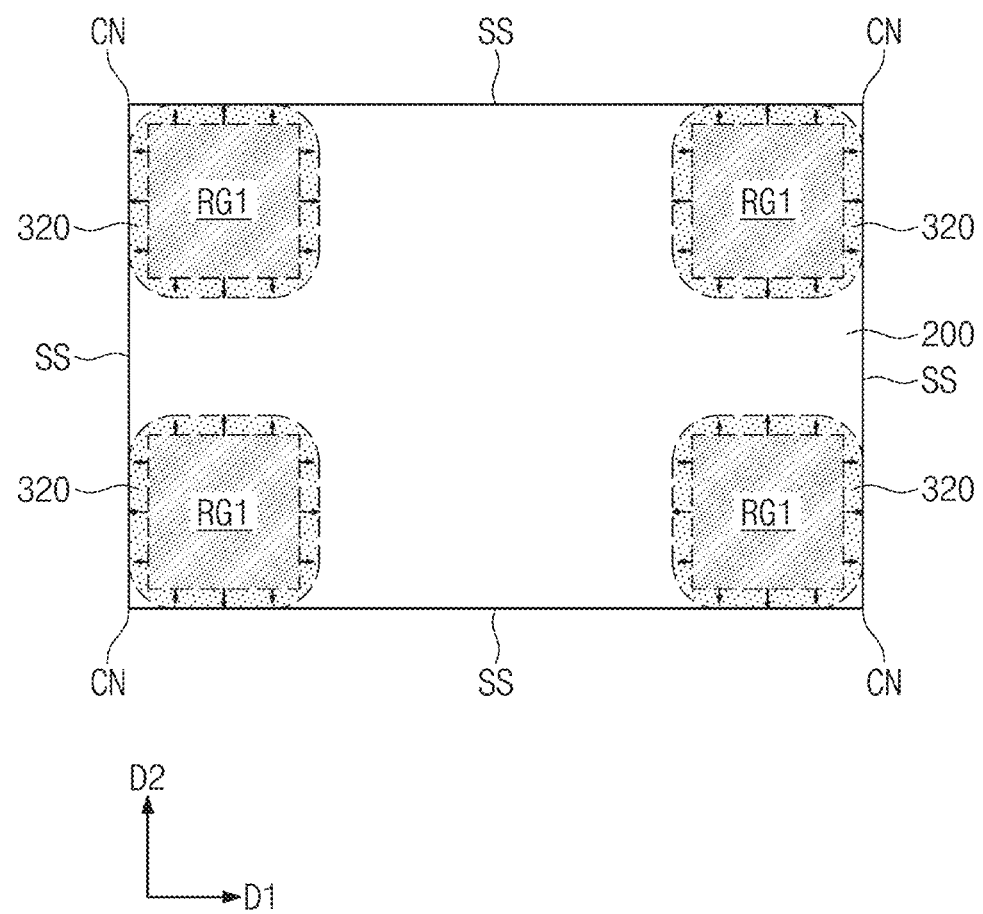
Figure 18:
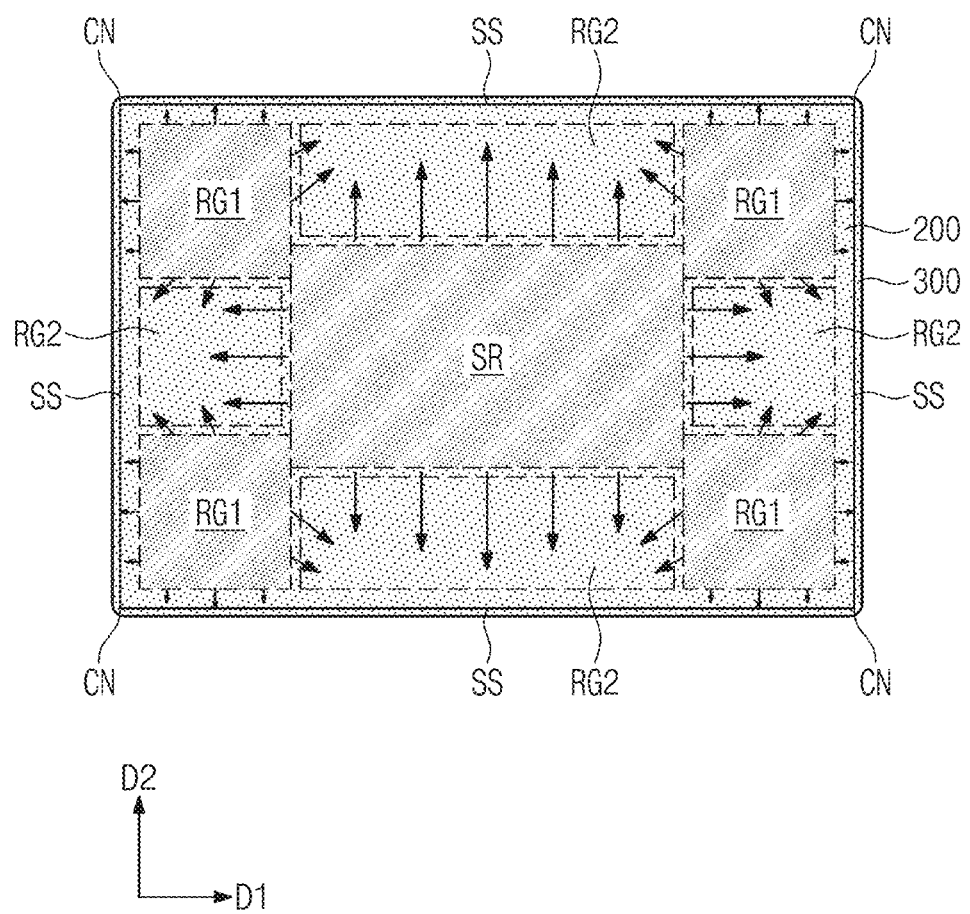

FIG. 16 shows a simplified flow of the under-fill 300 on the signal region SR. In FIGS. 16 to 18, lengths of arrows may each correspond to a flux of the under-fill 300. The signal region SR may include wiring lines for signals that are processed in an integrated circuit of the second die 200, and for line integration and thermal radiation, the connection terminals 240 may have a density that is relatively greater on the signal region SR than on the peripheral region PR. As shown in FIG. 16, in the thermocompression process, the under-fill 300 may flow outwardly from the signal region SR where there is a large amount of the under-fill 300 accumulated on the connection terminals 240. For example, as indicated by arrows in FIG. 16, an external pressure may cause the first accumulation 310 accumulated on the connection terminals 240 to flow outwardly from the signal region SR. When viewed in a plan view, the first accumulation 310 may radially spread from the signal region SR. In this case, the under-fill 300 may fill from a location (e.g., the second region RG2 of FIG. 10) adjacent to the signal region SR toward a location between the first die 100 and the second die 200. For example, an amount of the first accumulation 310 that flows from the signal region SR toward the first regions RG1 may be less than that of the first accumulation 310 from the signal region SR toward the second regions RG2.

When the connection terminals 240 are provided to have a uniform density on the peripheral region PR, between the first die 100 and the second die 200, a section on the corners CN farthest away from the signal region SR may be last filled with the under-fill 300 or may not be filled with the under-fill 300. When an amount of the under-fill 300 is increased to allow the under-fill 300 to completely fill a space between the first die 100 and the second die 200, there may be a large amount of the under-fill 300 that protrudes onto the lateral surfaces SS of the second die 200. In this case, the under-fill 300 that protrudes onto the lateral surfaces SS of the second die 200 may collide with another second die 200.

FIG. 17 shows a simplified flow of the under-fill 300 on the first regions RG1. According to some example embodiments of inventive concepts, the connection terminals 240 may have a high density on locations (e.g., the first regions RG1) around the corners CN where there is a small amount of the under-fill 300 that flows from the signal region SR. As shown in FIG. 17, in the thermocompression process, the under-fill 300 may flow outwardly from the first regions RG1 where there is a large amount of the under-fill 300 accumulated on the connection terminals 240. For example, as indicated by arrows in FIG. 17, an external pressure may cause the second accumulation 320 accumulated on the connection terminals 240 to flow outwardly from the first regions RG1.

FIG. 18 shows an overall flow of the under-fill 300 on the second die 200. As shown in FIG. 18, the under-fill 300 may have a large flux on the signal region SR and the first regions RG1. For example, under-fill 300 may flow toward the second regions RG2 from the signal region SR and the first regions RG1. Therefore, between the first die 100 and the second die 200, the under-fill 300 may easily fill a space around the corners CN wherein there is a small amount of the under-fill 300 that flows from the signal region SR. As indicated by arrows in FIG. 18, a flux of the under-fill 300 may be substantially identical or similar at each position on the lateral surfaces SS of the second die 200, and there may be a small amount of the under-fill 300 that protrudes onto the lateral surfaces SS of the second die 200. After the thermocompression process, the under-fill 300 may eventually have a planar shape similar to that of the second die 200.

Figure 19:
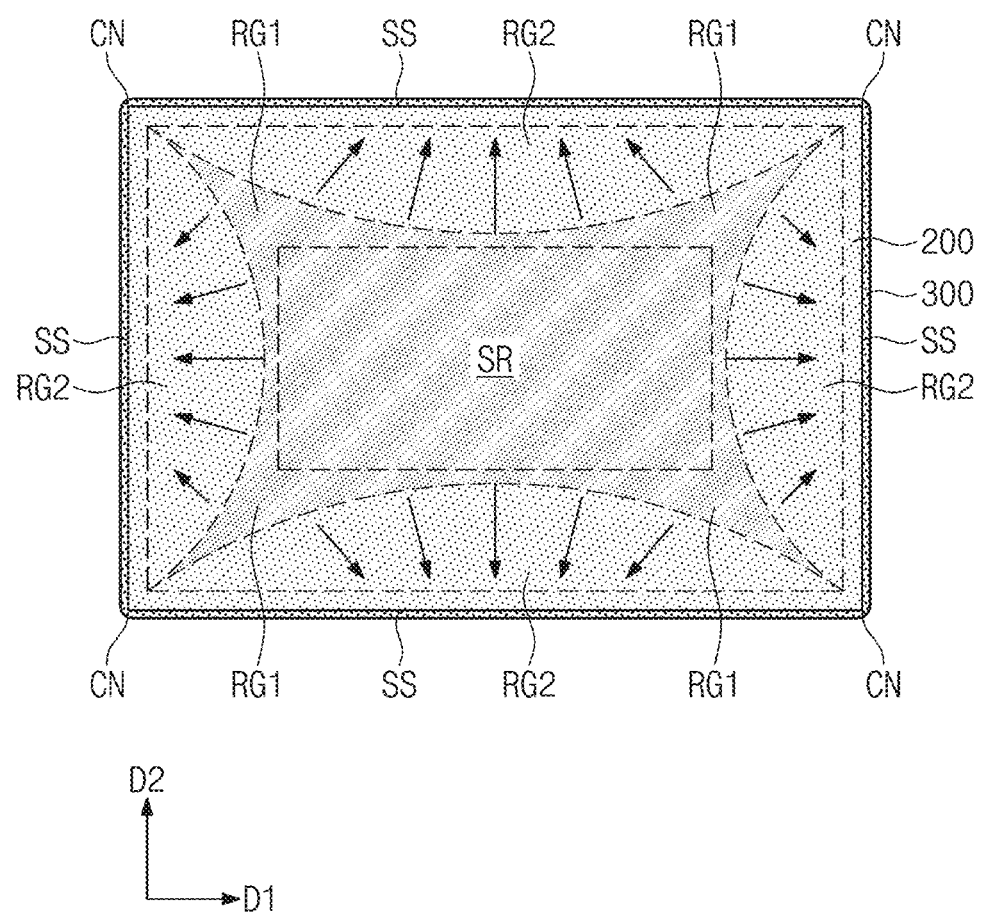
Figure 20:
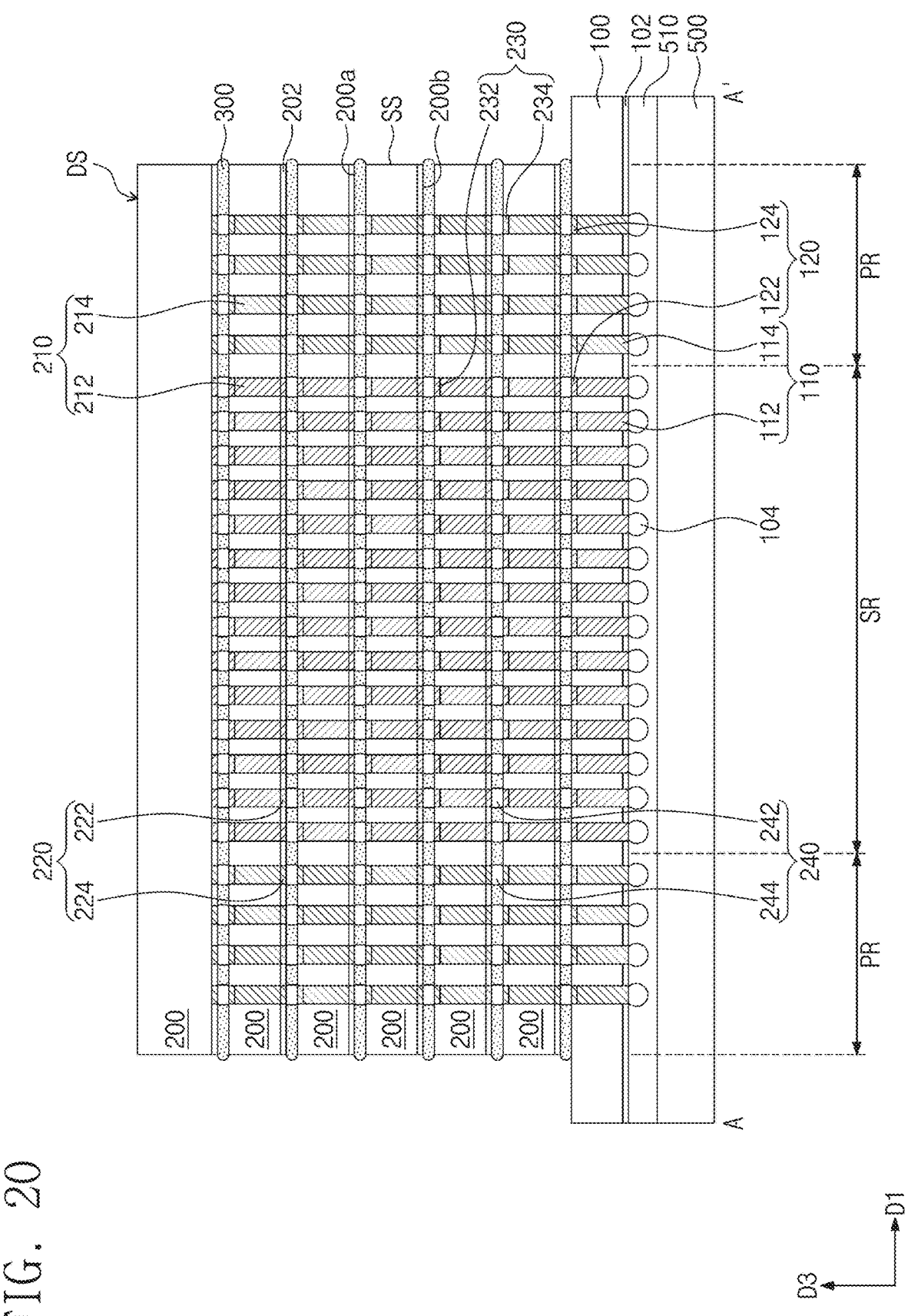
FIG. 20 illustrates a cross-sectional view showing a method of fabricating a semiconductor package according to some example embodiments of inventive concepts.

When the first regions RG1 are provided as in the embodiment of FIG. 7, as shown in FIG. 19, the under-fill 300 may flow from the signal region SR and the first regions RG1 toward the second regions RG2, for example, toward the lateral surfaces SS of the second die 200. As illustrated in FIG. 19, the first regions RG1 may be provided to extend from the signal region SR toward the corners CN of the second die 200, and the under-fill 300 may flow from the signal region SR and the first regions RG1 toward the lateral surfaces SS of the second die 200. As a flux of the under-fill 300 decreases in directions from the signal region SR toward the corners CN of the second die 200, as indicated by arrows in FIG. 19, the flux of the under-fill 300 may be substantially identical or similar at each position on the lateral surfaces SS of the second die 200.

According to some example embodiments of inventive concepts, a flow of the under-fill 300 may be controlled by using a density of the connection terminals 240 between the first die 100 and the second die 200. Therefore, voids may be limited and/or prevented from generating in the under-fill 300 between the first die 100 and the second die 200, or the under-fill 300 may be limited and/or prevented from excessively protruding onto the lateral surfaces SS of the second die 200 and colliding with another adjacent second die 200. As a result, it may be possible to provide a method of fabricating a semiconductor package, which method is capable of reducing the occurrence of defects.

Referring to FIG. 20, a plurality of second dies 200 may be stacked on the second die 200. In this case, an uppermost second die 200 may not include the second via 210. A mounting of the second dies 200 may be substantially the same as the process in which the second die 200 is mounted on the first die 100 discussed with reference to FIGS. 13 to 19.

Other second die 200 may be mounted on one second die 200. For example, the connection terminals 240 may be attached onto the bottom surface 200b of an overlying second die 200, and an overlying second die 200 may face down to allow its bottom surface 200b to face toward the top surface 200a of an underlying second die 200. The second dies 200 may be aligned to allow the connection terminals 240 to lie between the second upper pads 220 and the second lower pads 230.

Afterwards, a reflow process may be performed on the connection terminals 240. Therefore, the connection terminals 240 may connect the second upper pads 220 to the second lower pads 230. For example, the first connection terminals 242 may connect the second upper signal pads 222 to the second lower signal pads 232, and the second connection terminals 244 may connect the first upper power/ground pads 224 to the second lower power/ground pads 234. The connection terminals 240 melted in the reflow process may be attached to the second upper pads 220 and the second lower pads 230.

Heat and pressure provided in the reflow process may cause the under-fill 300 to flow between the first die 100 and the second die 200. For example, the under-fill 300 may flow outwardly from a central portion of the second die 200. In this case, as the peripheral region PR include the first regions RG1 where the connection terminals 240 have a high density, voids may be limited and/or prevented from generating in the under-fill 300 between the first die 100 and the second die 200, or the under-fill 300 may be limited and/or prevented from excessively protruding onto the lateral surfaces SS of the second die 200 and colliding with an another adjacent second die 200.

A plurality of second dies 200 may be electrically connected to each other through the connection terminals 240 provided on the bottom surfaces 200b of the plurality of second dies 200. The connection terminals 240 may connect the second upper pads 220 and the second lower pads 230 that are adjacent to each other in the third direction D3.

Referring back to FIG. 1, a molding layer 400 may be formed on the top surface of the first die 100. The molding layer 400 may cover the top surface of the first die 100. When viewed in a plan view, the molding layer 400 may surround the second dies 200. The molding layer 400 may include a dielectric polymer material. For example, the molding layer 400 may include an epoxy molding compound (EMC).

Thereafter, the carrier substrate 500 and the carrier adhesion layer 510 may be removed. For example, the carrier substrate 500 and the carrier adhesion layer 510 may be removed to expose the external terminals 104 and a passivation layer (not shown) of the first die 100.

The processes mentioned above may fabricate a semiconductor package.

According to some example embodiments of inventive concepts, a semiconductor package may limit and/or prevent a die from protruding onto a lateral surface of the die and colliding with another adjacent die, and thus the dies may be limited and/or prevented from being damaged caused by an under-fill or being delaminated from other adjacent die. Thus, the semiconductor package may be provided to have improved structural stability.

According to some example embodiments of inventive concepts, a method of fabricating a semiconductor package may control flows of an under-fill by using a density of connection terminals between dies. Therefore, voids may be limited and/or prevented from generating in the under-fill between the dies, or the under-fill may be limited and/or prevented from excessively protruding onto lateral surfaces of the dies and colliding with another adjacent die. Accordingly, a method of fabricating a semiconductor package may reduce the occurrence of defects.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although inventive concepts have been described in connection with some example embodiments of inventive concepts illustrated in the accompanying drawings, it will be understood by one of ordinary skill in the art that variations in form and detail may be made therein without departing from the spirit and scope of inventive concepts as set forth in the claims. The above disclosed embodiments should thus be considered illustrative and not restrictive.

What is claimed is:

1. A semiconductor package, comprising:
    a first die having a signal region and a peripheral region that surrounds the signal region, the first die including a plurality of first vias on the peripheral region;
    a second die on the first die and having a plurality of second vias on the peripheral region, the plurality of second vias being on positions that correspond to positions of the first vias; and
    a plurality of connection terminals between the first die and the second die, the plurality of connection terminals connecting the plurality of second vias to the plurality of first vias,
    wherein the peripheral region includes a plurality of first regions and a plurality of second regions,
    the plurality of first regions are adjacent to corners of the first die when viewed in a plan view, and
    the plurality of second regions are adjacent to lateral surfaces of the first die when viewed in the plan view,
    wherein the plurality of connection terminals include a plurality of first connection terminals on the plurality of first regions and a plurality of second connection terminals on the plurality of second regions, and
    wherein a sum of areas of the plurality of first connection terminals per unit area on the plurality of first regions is greater than a sum of areas of the plurality of second connection terminals per unit area on the plurality of second regions.

2. The semiconductor package of claim 1, wherein a height of the plurality of first connection terminals is equal to a height of the plurality of second connection terminals.

3. The semiconductor package of claim 1, wherein
    the plurality of first connection terminals and the plurality of second connection terminals have substantially a same shape, and
    a number of the plurality of first connection terminals per unit area on the plurality of first regions is greater than a number of the plurality of second connection terminals per unit area on the plurality of second regions.

4. The semiconductor package of claim 1, wherein an area of a top surface of each of the plurality of first connection terminals is greater than an area of a top surface of each of the plurality of second connection terminals.

5. The semiconductor package of claim 1, wherein an interval between the plurality of second connection terminals that are adjacent to each other is about 2 times to about 5 times an interval between the plurality of first connection terminals that are adjacent to each other.

6. The semiconductor package of claim 1, wherein
    the plurality of connection terminals further include a plurality of third connection terminals on the signal region,
    wherein the sum of areas of the plurality of first connection terminals per unit area on the plurality of first regions is about 0.8 times to about 1.2 times a sum of areas of the plurality of third connection terminals per unit area on the signal region.

7. The semiconductor package of claim 6, wherein
    the first die further includes a plurality of third vias on the signal region,
    the second die further includes a plurality of fourth vias on positions that correspond to positions of the plurality of third vias, and
    the plurality of third connection terminals connect the plurality of fourth vias to the plurality of third vias between the first die and the second die.

8. The semiconductor package of claim 1, wherein the plurality of first regions are connected to the signal region.

9. The semiconductor package of claim 8, wherein, when viewed in the plan view, each of the plurality of first regions have a width that decreases in a direction from the signal region toward a corresponding one of the corners of the first die.

10. The semiconductor package of claim 8, wherein
    a planar shape of the plurality of first regions is a linear shape that extends from the signal region toward a corresponding one of the corners of the first die, or
    the planar shape of the plurality of first regions is a tetragonal shape.

11. The semiconductor package of claim 1, wherein, when viewed in the plan view, each of the plurality of second regions have a width that decreases in a direction toward a corresponding one of the corners of the first die from an intermediate location on a corresponding one of the lateral surfaces of the first die.

12. The semiconductor package of claim 1, further comprising:
an under-fill between the first die and the second die,
wherein the under-fill surrounds the plurality of first connection terminals and the plurality of second connection terminals, and
wherein outer lateral surfaces of the under-fill are substantially parallel to lateral surfaces of the first die.

13. The semiconductor package of claim 1, wherein the plurality of connection terminals include a solder ball or a solder bump.

14. A semiconductor package, comprising:
a substrate;
a plurality of dies vertically stacked on the substrate;
an under-fill filling a space between the plurality of dies;
a molding layer on the substrate and covering the plurality of dies; and
a plurality of external terminals on a bottom surface of the substrate,
wherein each of the plurality of dies includes a plurality of vias that vertically penetrate the plurality of dies, a plurality of signal terminals on a signal region of the dies and coupled to the plurality of vias, and a plurality of power/ground terminals on a peripheral region that surrounds the signal region, are coupled to the plurality of vias, and
wherein a number of the plurality of power/ground terminals per unit area on the peripheral region decreases with an increasing distance from corners of the plurality of dies along lateral surfaces of the plurality of dies.

15. The semiconductor package of claim 14, wherein the number of the power/ground terminals per unit area on the peripheral region decreases with an increasing distance from a straight line that links the signal region to a corresponding corner among the corners of the plurality of dies.

16. The semiconductor package of claim 14, wherein
the peripheral region includes a plurality of a plurality of first regions and a plurality of second regions,
the plurality of first regions are adjacent to the corners of the plurality of dies when viewed in a plan view, and
the plurality of second regions are adjacent to the lateral surfaces of the plurality of dies when viewed in the plan view,
wherein a sum of areas of the plurality of power/ground terminals per unit area on the plurality of first regions is greater than a sum of areas of the plurality of power/ground terminals per unit area on the plurality of second regions.

17. The semiconductor package of claim 16, wherein an area of a top surface of each of the plurality of power/ground terminals on the plurality of first regions is greater than an area of a top surface of each of the plurality of power/ground terminals on the plurality of second regions.

18. The semiconductor package of claim 16, wherein an interval between the plurality of power/ground terminals that are adjacent to each other on the plurality of first regions is about 2 times to about 5 times an interval between the plurality of power/ground terminals that are adjacent to each other on the plurality of second regions.

19. The semiconductor package of claim 16, wherein a planar shape of the plurality of first regions is a linear shape that is directed from the signal region toward a corresponding corner among the corners of a corresponding one of the plurality of dies, or the planar shape of the plurality of first regions is a rectangular shape.

20. The semiconductor package of claim 14, wherein
the number of the plurality of power/ground terminals per unit area is a minimum on an intermediate location between two corners of a corresponding one of the plurality of dies, and
the two corners are adjacent to each other across a lateral surface of the corresponding one of the plurality of dies.

* * * * *